(12) United States Patent
Sharma et al.

(10) Patent No.: US 11,870,429 B2
(45) Date of Patent: Jan. 9, 2024

(54) CIRCUITS AND METHODS FOR CONTROLLING A VOLTAGE OF A SEMICONDUCTOR SUBSTRATE

(71) Applicant: Navitas Semiconductor Limited, Dublin (IE)

(72) Inventors: Santosh Sharma, Austin, TX (US); Daniel M. Kinzer, El Segundo, CA (US); Ren Huei Tzeng, Redondo Beach, CA (US)

(73) Assignee: Navitas Semiconductor Limited, Dublin (IE)

( * ) Notice: Subject to any disclaimer, the term of this patent is extended or adjusted under 35 U.S.C. 154(b) by 0 days.

(21) Appl. No.: 18/064,185

(22) Filed: Dec. 9, 2022

(65) Prior Publication Data

US 2023/0112152 A1 Apr. 13, 2023

Related U.S. Application Data

(63) Continuation of application No. 17/850,792, filed on Jun. 27, 2022.
(Continued)

(51) Int. Cl.
*H03K 17/082* (2006.01)
*G05F 3/26* (2006.01)
(Continued)

(52) U.S. Cl.
CPC ......... *H03K 17/0822* (2013.01); *G05F 3/262* (2013.01); *H01L 29/2003* (2013.01); *H03K 17/6871* (2013.01)

(58) Field of Classification Search
CPC ............ H03K 17/0822; H03K 17/6871; G05F 3/262; H01L 29/2003
See application file for complete search history.

(56) References Cited

U.S. PATENT DOCUMENTS 9,571,086 B1 2/2017 Romas, Jr. et al.
2008/0143421 A1 6/2008 Yanagihara et al.
(Continued)

FOREIGN PATENT DOCUMENTS

TW 200601578 A 1/2006
TW 201630187 A 8/2016
(Continued)

OTHER PUBLICATIONS

PCT/US2022/035326, "International Search Report and Written Opinion", dated Sep. 26, 2022, 10 pages.
(Continued)

*Primary Examiner* — Metasebia T Retebo
(74) *Attorney, Agent, or Firm* — Kilpatrick Townsend & Stockton LLP

(57) ABSTRACT

An electronic device includes a semiconductor substrate and a bidirectional transistor switch formed on the substrate, the bidirectional switch including a first source node, a second source node and a common drain node. A first transistor is formed on the substrate and includes a first source terminal, a first drain terminal and a first gate terminal, wherein the first source terminal is connected to the substrate, the first drain terminal is connected to the first source node and the first gate terminal is connected to the second source node. A second transistor is formed on the substrate and includes a second source terminal, a second drain terminal and a second gate terminal, wherein the second source terminal is connected to the substrate, the second drain terminal is connected to the second source node and the second gate terminal is connected to the first source node.

20 Claims, 14 Drawing Sheets

Related U.S. Application Data

(60) Provisional application No. 63/202,901, filed on Jun. 29, 2021.

(51) Int. Cl.
   *H01L 29/20* (2006.01)
   *H03K 17/687* (2006.01)

(56) References Cited

U.S. PATENT DOCUMENTS

| | | |
|---|---|---|
| 2009/0065810 A1 | 3/2009 | Honea et al. |
| 2011/0175669 A1 | 7/2011 | Webb |
| 2014/0009189 A1 | 1/2014 | Mauder et al. |
| 2015/0263100 A1 | 9/2015 | Deboy |
| 2016/0056815 A1 | 2/2016 | Alexander et al. |
| 2017/0222644 A1 | 8/2017 | Kinzer et al. |
| 2019/0006499 A1 | 1/2019 | Kinoshita et al. |
| 2019/0273488 A1 | 9/2019 | Reiter et al. |
| 2019/0326280 A1* | 10/2019 | Imam ............... H01L 29/42316 |
| 2021/0104453 A1 | 4/2021 | Kinoshita et al. |
| 2021/0134963 A1 | 5/2021 | Nomura et al. |

FOREIGN PATENT DOCUMENTS

| | | |
|---|---|---|
| TW | 201806165 A | 2/2018 |
| TW | 202101717 A | 1/2021 |
| WO | 2020090923 A1 | 5/2020 |

OTHER PUBLICATIONS

U.S. Appl. No. 17/850,792, "Final Office Action", dated Jun. 23, 2023, 11 pages.
U.S. Appl. No. 17/850,792, "Non-Final Office Action", dated Mar. 1, 2023, 10 pages.
TW111124081, "Office Action", dated May 3, 2023, 6 pages.
U.S. Appl. No. 17/850,792, "Advisory Action", dated Aug. 29, 2023, 3 pages.
U.S. Appl. No. 17/850,792, "Non-Final Office Action", dated Oct. 11, 2023, 12 pages.

* cited by examiner

CIRCUITS AND METHODS FOR CONTROLLING A VOLTAGE OF A SEMICONDUCTOR SUBSTRATE

CROSS-REFERENCES TO OTHER APPLICATIONS

This application is a continuation of U.S. patent application Ser. No. 17/850,792, for "CIRCUITS AND METHODS FOR CONTROLLING A VOLTAGE OF A SEMICONDUCTOR SUBSTRATE," filed Jun. 27, 2022, which claims priority to U.S. provisional patent application Ser. No. 63/202,901, for "CIRCUITS AND METHODS FOR CONTROLLING A VOLTAGE OF A SEMICONDUCTOR SUBSTRATE" filed on Jun. 29, 2021, both of which are hereby incorporated by reference in their entirety for all purposes.

TECHNICAL FIELD

The subject matter described herein relates to clamping a voltage applied to a semiconductor substrate, and more particularly to clamping both positive and negative voltage excursions of a substrate on which a bidirectional transistor is formed.

BACKGROUND

Electrical performance of certain semiconductor-based circuits may be dependent on a voltage of the semiconductor substrate on which they are formed. Accordingly, when the voltage of the substrate changes, the circuits may have undesirable or unpredictable performance. Accordingly, the performance and/or predictability of semiconductor-based electrical circuits can be improved by clamping (e.g., limiting) the voltage excursions of the substrate.

SUMMARY

In some embodiments an electronic device comprises a gallium nitride (GaN) substrate comprising a GaN-based top layer attached to a silicon-based bottom layer. A bidirectional transistor switch is formed on the GaN-based top layer and includes a first source node, a second source node and a common drain node. A first transistor is formed on the GaN-based top layer and includes a first source terminal, a first drain terminal and a first gate terminal, the first source terminal connected to the silicon-based bottom layer, the first drain terminal connected to the first source node and the first gate terminal connected to the second source node. A second transistor is formed on the GaN-based top layer and includes a second source terminal, a second drain terminal and a second gate terminal, the second source terminal connected to the silicon-based bottom layer, the second drain terminal connected to the second source node and the second gate terminal connected to the first source node.

In some embodiments the electronic device further comprises a first diode including a first anode and a first cathode, the first anode connected to the silicon-based bottom layer and the first cathode connected to the first source node; and a second diode including a second anode and a second cathode, the first anode connected to the silicon-based bottom layer and the second cathode connected to the second source node. In various embodiments the first and second diodes are monolithically formed on the GaN substrate. In some embodiments the first and second diodes are formed on one or more silicon carbide (SiC) substrates.

In some embodiments the electronic device further comprises a third transistor formed on the GaN-based top layer and including a third drain, a third source and a third gate, the third gate connected to a voltage source, the third drain connected to the first source node and the third source connected to the second gate terminal; and a fourth transistor formed on the GaN-based top layer and including a fourth drain, a fourth source and a fourth gate, the fourth gate connected to the voltage source, the fourth drain connected to the second source node, and the fourth source connected to the first gate terminal.

In some embodiments the third and fourth transistors are depletion-mode field effect transistors (FETs). In various embodiments the third and fourth transistors are enhancement-mode field effect transistors (FETs). In some embodiments the third and the fourth transistors each comprise two or more FETs connected in series.

In some embodiments an electronic device comprises a semiconductor substrate and a bidirectional transistor switch formed on the substrate and including a first source node, a second source node and a common drain node. A first transistor is formed on the substrate and includes a first source terminal, a first drain terminal and a first gate terminal, the first source terminal connected to the substrate, the first drain terminal connected to the first source node and the first gate terminal connected to the second source node; and a second transistor is formed on the substrate and includes a second source terminal, a second drain terminal and a second gate terminal, the second source terminal connected to the substrate, the second drain terminal connected to the second source node and the second gate terminal connected to the first source node.

In some embodiments the semiconductor substrate comprises GaN. In various embodiments the semiconductor substrate comprises silicon. In some embodiments a first diode includes a first anode and a first cathode, the first anode connected to the substrate and the first cathode connected to the first source node; and a second diode including a second anode and a second cathode, the first anode connected to the substrate and the second cathode connected to the second source node.

In some embodiments the first and second diodes are monolithically formed on the substrate. In various embodiments the first and second diodes are formed on one or more silicon carbide (SiC) substrates. In some embodiments the electronic device further comprises a third transistor formed on the substrate and including a third drain, a third source and a third gate, the third gate connected to a voltage source, the third drain connected to the first source node and the third source connected to the second gate terminal; and a fourth transistor formed on the substrate and including a fourth drain, a fourth source and a fourth gate, the fourth gate connected to the voltage source, the fourth drain connected to the second source node, and the fourth source connected to the first gate terminal.

In some embodiments the third and fourth transistors are depletion-mode field effect transistors (FETs). In various embodiments the third and fourth transistors are enhancement-mode field effect transistors (FETs). In some embodiments the third and the fourth transistors each comprise two or more FETs connected in series.

In some embodiments a method of forming a circuit comprises forming a semiconductor substrate, forming a bidirectional transistor on the semiconductor substrate, the bidirectional transistor including a first source node, a second source node and a common drain node, forming a first transistor on the substrate, the first transistor including a first source terminal, a first drain terminal and a first gate terminal, the first source terminal connected to the substrate, the first drain terminal connected to the first source node and the first gate terminal connected to the second source node and forming a second transistor on the substrate, the second transistor including a second source terminal, a second drain terminal and a second gate terminal, the second source terminal connected to the substrate, the second drain terminal connected to the second source node and the second gate terminal connected to the first source node. In various embodiments the semiconductor substrate comprises GaN.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations.

When practical, similar reference numbers denote similar structures, features, or elements.

DETAILED DESCRIPTION

Figure 1A:
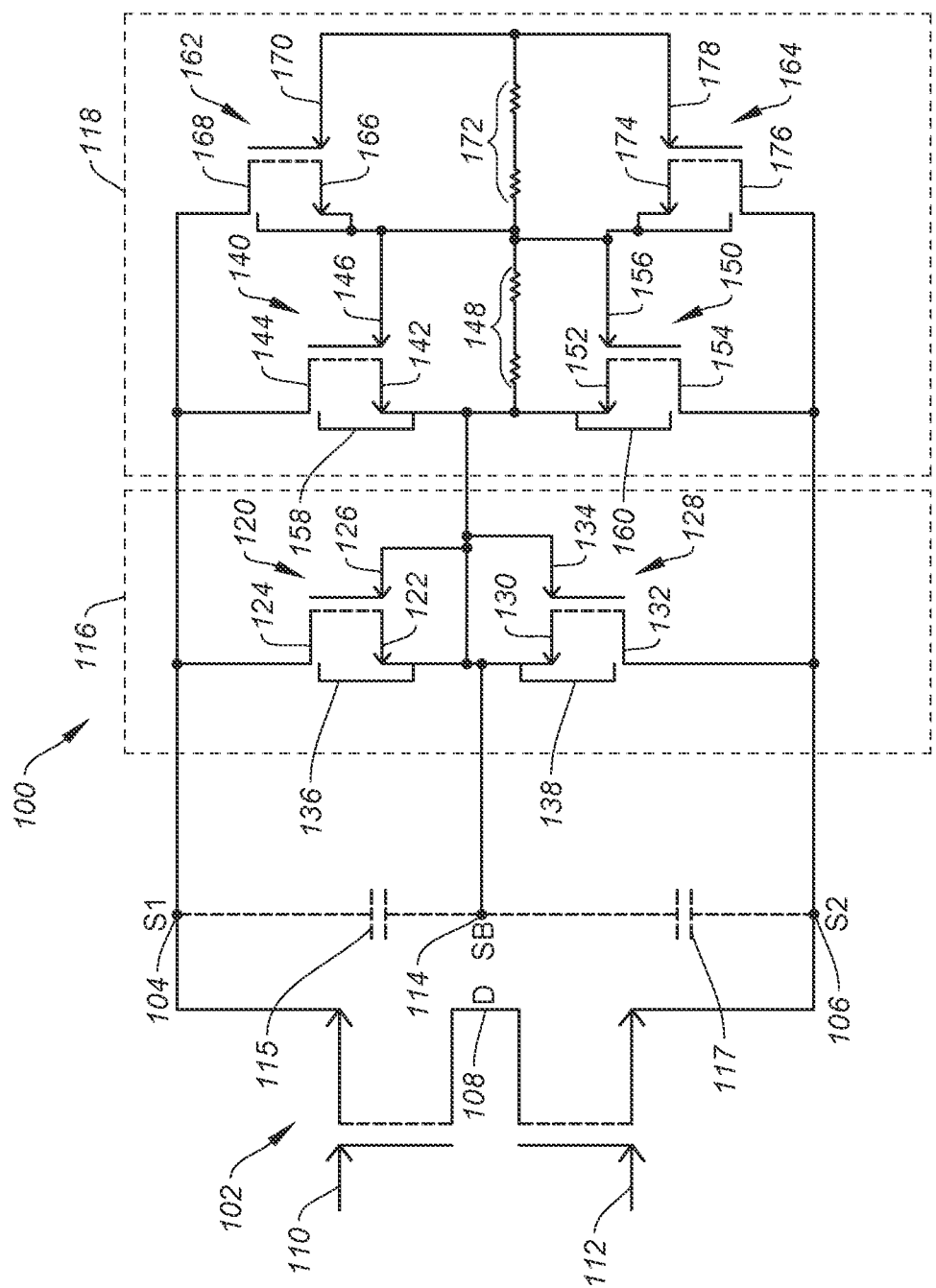
FIG. 1A illustrates a schematic illustration of a clamping circuit connected with a bidirectional switch according to an embodiment.

Techniques disclosed herein relate generally to controlling a voltage of a semiconductor substrate on which one or more semiconductor devices are formed. More specifically, techniques disclosed herein relate to a clamping circuit that controls a voltage of a GaN substrate during transients caused by a GaN-based bidirectional switch that is formed on the substrate. Various inventive embodiments are described herein, including methods, processes, circuits, devices, and the like.

Clamping Circuit with Mirrored Transistor Pair

For example, in some embodiments a GaN-based bidirectional switch can be formed on a substrate that includes a GaN-based top layer attached to a silicon-based bottom layer. The bidirectional switch can include a first source node, a second source node and a common drain node. A clamping circuit is formed on the GaN-based top layer and is arranged to clamp positive and negative variations in a voltage of the substrate due to dV/dt events (relatively large changes in voltage with respect to time) at the first and the second source nodes. More specifically, in on embodiment the clamping circuit includes a mirrored diode clamping circuit configured to clamp positive dV/dt events and a mirrored switch circuit configured to clamp negative dV/dt events.

In some embodiments the mirrored diode circuit includes a pair of diode-connected transistors that are coupled between the first source node and the substrate and between the second source node and the substrate. During positive dV/dt events the pair of diode-connected transistors enable the substrate voltage to be maintained at approximately one threshold voltage (of the diode-connected transistors) away from the source node voltage that is closest to zero volts.

The mirrored switch circuit can include any number of mirrored pairs of transistors with additional mirrored pairs resulting in faster clamping and less voltage variation of the substrate. In some embodiments the mirrored switch circuit includes a first GaN-based transistor including a first source terminal, a first drain terminal and a first gate terminal, wherein the first source terminal is connected to the substrate terminal, the first drain terminal is connected to the first source node and the first gate terminal is connected to the substrate terminal through one or more resistors. A second GaN-based transistor includes a second source terminal, a second drain terminal and a second gate terminal, wherein the second source terminal is connected to the substrate terminal, the second drain terminal is connected to the second source node and the second gate terminal is connected to the substrate terminal through the one or more resistors. During negative dV/dt events the appropriate switch is engaged and operates to reduce the change in voltage of the substrate. In some embodiments additional pairs of transistors can be added to the mirrored switch circuit causing the switch to engage earlier and further reduce the change in voltage of the substrate.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

FIG. 1A illustrates a simplified schematic of a substrate clamping circuit 100 that can be used in conjunction with a bidirectional switch 102, according to embodiments of the disclosure. As shown in FIG. 1A, bidirectional switch 102 includes a first source node 104, a second source node 106, a common drain node 108, a first gate node 110 and a second gate node 112. In some embodiments bidirectional switch 102 can function as a four quadrant switch, however in other embodiments it may be suitable for other uses. In some embodiments bidirectional switch 102 is formed on a substrate that can comprise gallium nitride, gallium nitride on silicon, silicon, gallium arsenide, indium phosphide or any other suitable semiconductor material. In this particular embodiment at least a portion of the substrate can be electrically conductive and is represented in substrate clamping circuit by substrate node 114.

A first parasitic capacitor 115 is shown by dashed lines and represents the parasitic capacitance formed between first source node 104 and substrate 114. That is, when first source node 104 changes voltage potential, first parasitic capacitor 115 causes substrate 114 to follow that change in potential. Similarly, a second parasitic capacitor 117 is shown by dashed lines and represents the parasitic capacitance formed between second source node 106 and substrate 114. Thus, during normal operation, substrate 114 (which is representative of a voltage of the substrate on which bidirectional switch 102 is formed) can change voltage causing uncontrolled operation of the bidirectional switch, especially during high rates of voltage transition, also called dV/dt events, at first and second source nodes, 104, 106, respectively.

Clamping circuit 100 is electrically coupled to bidirectional switch 102 to clamp (e.g., minimize excursions of) the voltage at substrate 114 during dV/dt events at first and second source nodes, 104, 106, respectively, so bidirectional switch 102 functions in a predictable and reliable manner. In this particular embodiment, clamping circuit 100 is arranged into two sub-circuits that include a mirrored diode circuit 116 that can predominantly clamp positive dV/dt events and into a mirrored switch circuit 118 that can predominantly clamp negative dV/dt events, as explained in more detail below. Clamping circuit 100 is not limited to the configuration shown in FIG. 1A and other suitable configurations can be used, some of which are described in more detail below.

Mirrored diode circuit 116 includes a first transistor 120 formed on substrate 114 and includes a first source terminal 122, a first drain terminal 124 and a first gate terminal 126, wherein the first source terminal is connected to substrate 114, the first drain terminal is connected to first source node 104 and the first gate terminal is connected to the substrate. Thus, first source terminal 122 is coupled to first gate terminal 126 causing first transistor 120 to function as a diode, allowing current to flow from the drain to the source and blocking current/voltage from the source to the drain. Similarly, a second transistor 128 is formed on substrate 114 and includes a second source terminal 130, a second drain terminal 132 and a second gate terminal 134, wherein the second source terminal is connected to substrate 114, the second drain terminal is connected to second source node 106 and the second gate terminal is connected to the substrate. Thus, second source terminal 130 is coupled to second gate terminal 134 causing second transistor 128 to function as a diode, allowing current to flow from the drain to the source and blocking current/voltage from the source to the drain. Thus, in a simplified form, first and second transistors 120, 128 form mirrored diodes that are coupled between first and second source nodes 104, 106, respectively and substrate 114.

Mirrored diode circuit 116 functions primarily to clamp a voltage of substrate 114 during positive dV/dt events at first and second source nodes 104, 106, respectively. More specifically, when a voltage of second source node 106 is greater than a voltage of first source node 104, second transistor (operating as a diode) clamps substrate 114 to a voltage that is 1 diode threshold voltage (Vth) above a voltage of first source node 104. Second transistor 128 also blocks the voltage between second node 106 and substrate 114. First transistor 120 functions similarly. When a voltage of first source node 104 is greater than a voltage of second source node 106, first transistor 120 (operating as a diode) clamps substrate 114 to a voltage that is 1 diode threshold voltage (Vth) above a voltage of second source node 106.

In some embodiments first and second transistors 120, 128, respectively may include first and second field plates 136, 138, respectively, to improve operation of the transistors. More specifically as shown in FIG. 1A first transistor 120 may include a first source field plate 136 that reduces the electric field between the gate and the drain. First source field plate 136 may also be coupled to substrate 114. Similarly, in some embodiments second transistor 128 may include a second source field plate 138 that is coupled to substrate 114.

Mirrored switch circuit 118 is illustrated in FIG. 1A as including four switches, however in some embodiments only two switches may be used, while in other embodiments more than four switches can be used, as shown in greater detail below. Mirrored switch circuit 118 is used predominantly to clamp a voltage of substrate 114 during negative dV/dt events at first and second source nodes 104, 106, respectively. A third transistor 140 is formed on substrate 114 and includes a third source terminal 142, a third drain terminal 144 and a third gate terminal 146, wherein the third source terminal is connected to substrate 114, the third drain terminal is connected to first source node 104 and the third gate terminal is connected to the substrate through one or more resistors 148. Similarly a fourth transistor 150 is formed on substrate 114 and includes a fourth source terminal 152, a fourth drain terminal 154 and a fourth gate terminal 156, wherein the fourth source terminal is connected to substrate 114, the fourth drain terminal is connected to second source node 106 and the fourth gate terminal is connected to the substrate through one or more resistors 148.

During negative dV/dt events at second source node 106 (e.g., where a voltage second source node 106 decreases relative to a voltage on first source node 104) a voltage at third gate terminal 146 transitions slower than a voltage at third source terminal 142. In some embodiments this slower transition can be due to one or more resistors 148 that are coupled between third gate terminal 146 and substrate 114, while in other embodiments one or more capacitances that are coupled to the third gate terminal may assist with slowing the transition of the third gate terminal, as explained in more detail below. As the voltage differential between third gate terminal 146 and third source terminal 142 reaches a threshold voltage of third transistor 140, the third transistor turns on, clamping substrate 114 to a voltage at first source node 104.

Similarly, during negative dV/dt events on first source node 104 (e.g., where a voltage of first source node 104 decreases relative to a voltage on second source node 106) a voltage at fourth gate terminal 156 transitions slower than a voltage at fourth source terminal 152. In some embodiments this slower transition can be due to one or more resistors 148 that are coupled between fourth gate terminal 156 and substrate 114, while in other embodiments one or more capacitances that are coupled to the fourth gate terminal may assist with slowing the transition of the fourth gate terminal, as explained in more detail below. As the voltage differential between fourth gate terminal 156 and fourth source terminal 152 reaches a threshold voltage of fourth transistor 150, the fourth transistor turns on, clamping substrate 114 to a voltage at second source node 106.

As appreciated by one of skill in the art having the benefit of this disclosure, a size of third and fourth transistors 140, 150, respectively, and of one or more resistors 148 can be selected to activate mirrored switch circuit 118 at an appropriate voltage differential and/or duration of the voltage differential to achieve reliable and robust performance of bidirectional switch 102 for a particular application. In some embodiments third transistor 140 may include a third source field plate 158 that is coupled to substrate 114 and similarly fourth transistor 150 may include a fourth source field plate 160 that is coupled to the substrate.

In some embodiments mirrored switch circuit 118 may include a fifth and sixth transistors 162, 164, respectively that assist with clamping a voltage of substrate 114 faster, as explained in more detail below. Fifth transistor 162 can be formed on substrate 114 and includes a fifth source terminal 166, a fifth drain terminal 168 and a fifth gate terminal 170, wherein the fifth source terminal is connected to third gate terminal 146, the fifth drain terminal is connected to first source node 104 and the fifth gate terminal is connected to substrate 114 through one or more second stage resistors 172 and the one or more resistors 148. Sixth transistor 164 can be formed on substrate 114 and includes a sixth source terminal 174, a sixth drain terminal 176 and a sixth gate terminal 178, wherein the sixth source terminal is connected to fourth gate terminal 156, the sixth drain terminal is connected to second source node 106 and the sixth gate terminal is connected to substrate 114 through the one or more second stage resistors 172 and the one or more resistors 148.

During negative dV/dt events fifth and sixth transistors 162, 164, respectively, may assist third and fourth transistors 140, 150, respectively, with clamping a voltage of substrate 114, as explained in more detail below. During negative dV/dt events at second source node 106 (e.g., where a voltage on second source node 106 decreases relative to a voltage on first source node 104) a voltage at fifth gate terminal 170 transitions slower than a voltage at fifth source terminal 166. In some embodiments this slower transition can be due to one or more second stage resistors 172. As the voltage differential between fifth gate terminal 170 and fifth source terminal 166 reaches a threshold voltage of fifth transistor 162, the fifth transistor turns on, pulling a voltage of third gate terminal 146 to a voltage at first source node 104. In some embodiments a size of an active area of fifth transistor 162 is smaller than a size of an active area of third transistor 140 which enables the fifth transistor to turn on before the third transistor. In one embodiment a size of an active area of third transistor 140 is 10 mm and a size of an active area of fifth transistor 162 is 1 mm, however other suitable active area sizes can be used. The operation of mirrored switch control circuit 118 can function in an opposite manner of that described above during negative dV/dt events at first source node 104.

Fifth transistor 162 and sixth transistor 164 also include inherent output capacitances that are coupled to third gate terminal 146 and assist with turning on third transistor during negative dV/dt events at first source node 104. More specifically, output capacitances of fifth and sixth transistors 162, 164 respectively, can be non-linear with respect to an applied voltage between the source and the drain. More specifically the lower the voltage differential between the drain and the source the higher the output capacitance of the transistor. Thus, for negative dV/dt events at first source node 104 with respect to second source node 106, an output capacitance of fifth transistor 162 pulls third gate terminal 146 down however, the capacitance works against an output capacitance of sixth transistor 164 that tries to keep the third gate terminal up. Sixth transistor 164 has a larger output capacitance than fifth transistor 162 because of the lower voltage across the sixth transistor as compared to the fifth transistor, thus the larger capacitance of sixth transistor overpowers the output capacitance of the fifth transistor and assists with the fast turn on of third transistor 140.

During negative dV/dt events at second source node 106 (e.g., where a voltage of second source node 106 decreases relative to a voltage on first source node 104) the operation of mirrored switch circuit 118 is opposite and maintains substrate 114 at a clamped voltage. In some embodiments fifth and sixth transistors 162, 164, respectively, can be replaced by one or more capacitors that are integrally formed on substrate 114, or can be formed externally. In some embodiments the integrally formed capacitors can be formed using one or more metal layers separated by a dielectric while in other embodiments they may be formed using a transistor structure having an inherent capacitance.

In some embodiments, bidirectional switch 102, mirrored diode circuit 116 and mirrored switch circuit 118 are formed on a monolithic semiconductor substrate. In embodiments that operate at high switching speeds the close proximity of all circuitry on a monolithic substrate may assist with management of circuit parasitics. However, in other embodiments one or more components of these circuits may be formed on a separate die and/or external to the substrate that the bidirectional switch is formed on.

In some embodiments bidirectional switch 102 may have a resistance drain to source in the on configuration (Rdson) of approximately 70 milliohms, however in other embodiments it can have a different suitable on-resistance. In some embodiments mirrored diode circuit 116 and/or mirrored switch circuit 118 can employ transistors that are rated to withstand up to 650 Volts, however in other embodiments transistors having a different suitable withstanding voltage can be used.

Figure 1B:
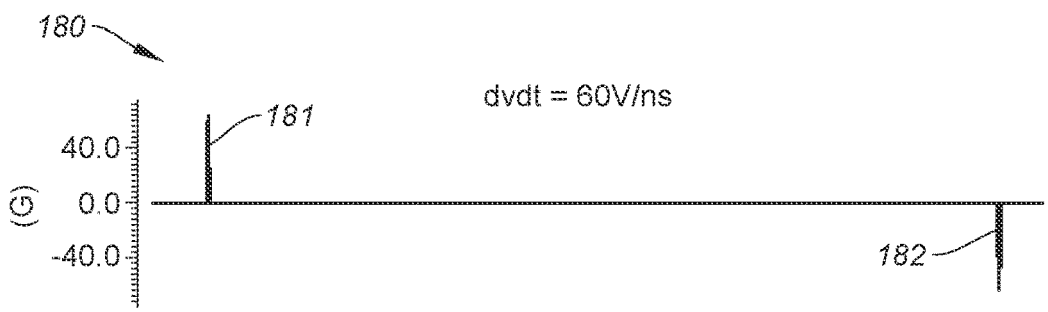
FIGS. 1B-1D illustrate graphs showing operational features of the clamping circuit of FIG. 1A.
Figure 1C:
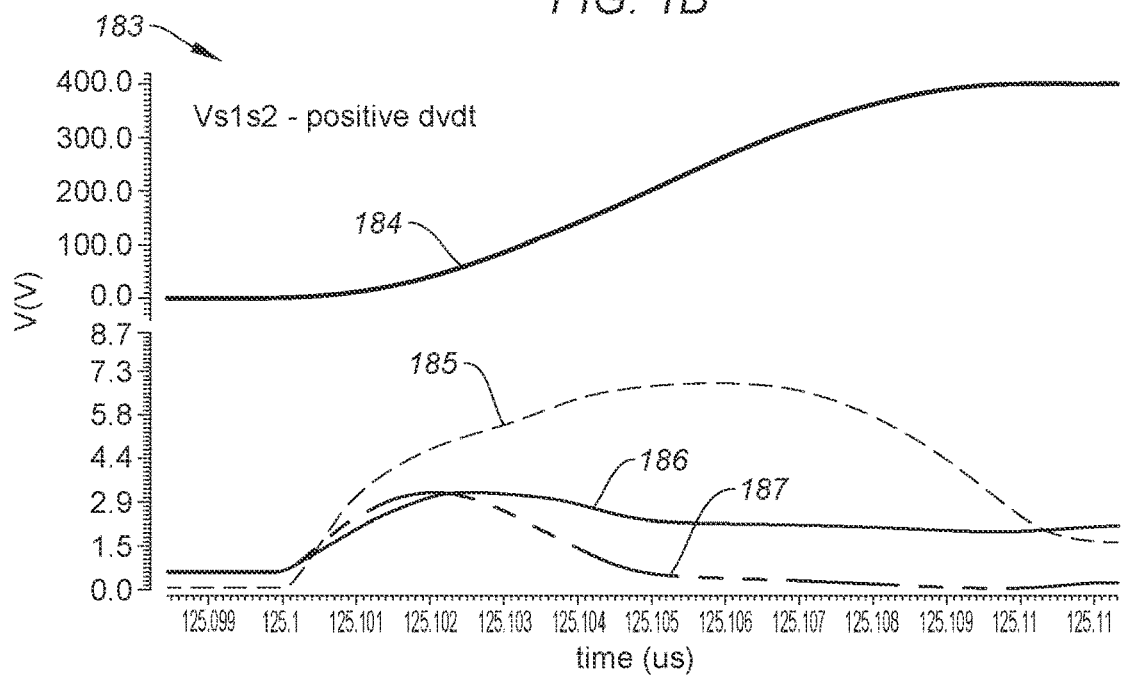

FIG. 1B illustrates an example dV/dt graph 180 that shows dV/dt events that can occur between first source node 104 (see FIG. 1A) and second source node 106. A positive dV/dt event 181 occurs followed by a negative dV/dt event 182 where the transient events occur at a rate of approximately 60 V/ns. FIG. 1C illustrates an example positive dV/dt operation graph 183 of clamp circuit 100 in response to a positive dV/dt event, such as positive dV/dt event 181 in FIG. 1B. As a differential voltage 184 of first node 104 (see FIG. 1A) with respect to second node 106 increases, substrate voltage 185 increases to follow the change in voltage. However, substrate voltage 185 is clamped primarily by operation of mirrored diode circuit 116. In addition, a voltage at third gate terminal 187 and a voltage at fifth gate terminal 186 increase with the rise in differential voltage 184 such that substrate 185 is clamped to a voltage of second node 106 plus one threshold voltage of third transistor 140 (see FIG. 1A). The opposite function of mirrored switch circuit 118 occurs when second source node 106 increases in voltage relative to first source node 104.

Figure 1D:
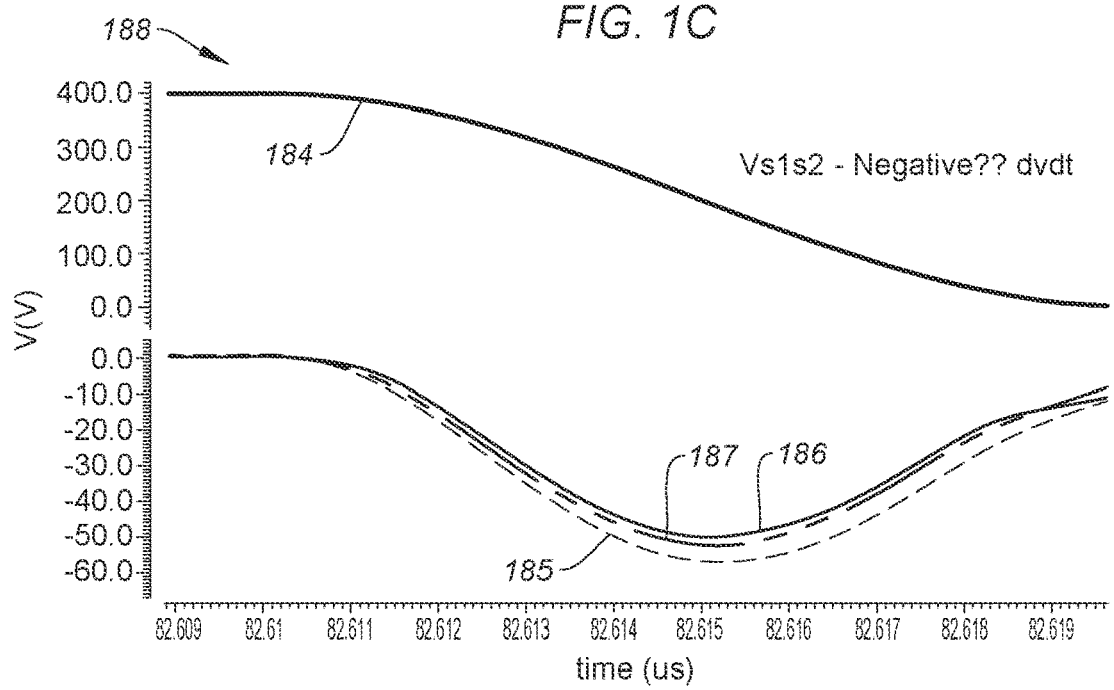

FIG. 1D illustrates an example negative dV/dt operation graph 188 of clamp circuit 100 in response to a negative dV/dt event. As differential voltage 184 of first node 104 with respect to second node 106 decreases, substrate voltage 185 decreases to follow the change in voltage. However, substrate voltage 185 is clamped due to a voltage at third gate terminal 187 turning on third transistor 140 and clamping substrate 185 to a voltage of first node 104 minus one threshold voltage of third transistor 140. A voltage at fifth gate terminal 186 is also shown which assists with the turning on of third transistor 140, as explained above.

Figure 1E:
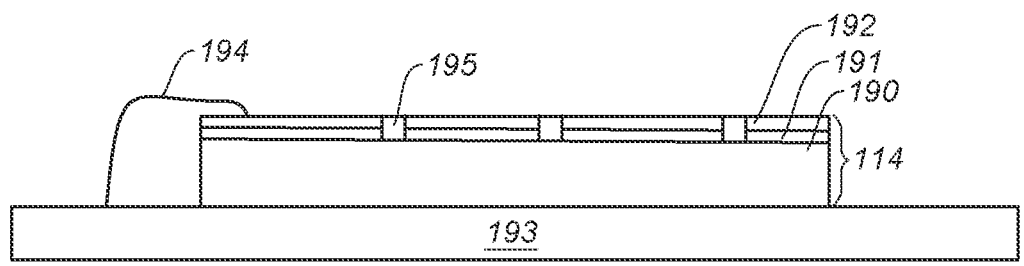
FIG. 1E illustrates a simplified cross-section of one example of a substrate according to an embodiment.

FIG. 1E illustrates a simplified cross-section of one example of substrate 114 shown in FIG. 1. As shown in FIG. 1E, in some embodiments substrate 114 can include a first layer 190 that can include silicon carbide, sapphire, silicon, aluminum nitride or other material. A second layer 191 is disposed on first layer 190 and can include gallium nitride or other material. A third layer 192 is disposed on second layer 191 and can include a composite stack of other III nitrides such as, but not limited to, aluminum nitride, indium nitride and III nitride alloys such as aluminum gallium nitride and indium gallium nitride. In one embodiment third layer 192 is Al0.20 Ga0.80 N. Substrate 114 may be electrically coupled to a die attach pad 193, that forms a portion of an electronic package.

In some embodiments, a two-dimensional electron gas (2DEG) inducing layer is formed within substrate 114 and can be positioned proximate an interface between second layer 191 and third layer 192. In some embodiments, the 2DEG layer is induced by a combination of piezoelectric effect (stress), bandgap differential, and/or polarization charge. For example, there may be a reduction in the conduction band at the surface, where it drops below the fermi level to create a potential well which fills with electrons. In some embodiments, the 2DEG inducing layer comprises AlGaN in a range, for example, of Al0.25 Ga0.75 N about 20 nanometers thick. In alternative embodiments, the 2DEG inducing layer can comprise AN, AlGaInN, or another material. In some embodiments, the 2DEG inducing layer comprises a thin boundary layer with high Al content and a thicker layer with less Al content. In some embodiments the 2DEG inducing layer can have a GaN cap layer while in other embodiments the 2DEG inducing layer does not have a GaN cap layer.

In some embodiments substrate 114 can comprise any suitable material or combination of layers of material with a conductive portion of a GaN voltage blocking layer. For example in some embodiments the substrate can comprise silicon-carbide or aluminum nitride with a conductive silicon layer that can function as a seed layer for a subsequent GaN layer. This construction may be commonly called a QST substrate.

In this particular embodiment first layer 190 may be electrically conductive and a voltage of this layer may be what is referred to in FIG. 1 as substrate 114. Second layer 191 and third layer 192 may be electrically insulative. Thus, to ohmically couple circuitry (e.g., source terminals of transistors, field plates, etc.) formed on a top surface of third layer 192 to first layer 190, wire bonds 194 from third layer 192 to die attach pad 193 may be used while in other embodiments one or more through-GaN vias 195 may be used that are ohmically coupled to first layer 190 and can be electrically insulated from second and third layer, 191, 192, respectively. For example, in one embodiment substrate node 114 in clamp circuit 100 shown in FIG. 1 can be formed with one or more through-GaN vias 195 and/or wire bonds 194 such that the clamp circuit can be ohmically coupled to first layer 190. In some embodiments multiple wirebond locations and/or through GaN vias may be used across substrate 114 to reduce voltage differentials within substrate 114. In some embodiments die attach pad 193 is electrically coupled to substrate 114 using solder, electrically conductive adhesive, fusion bonding or other suitable process.

Figure 2A:
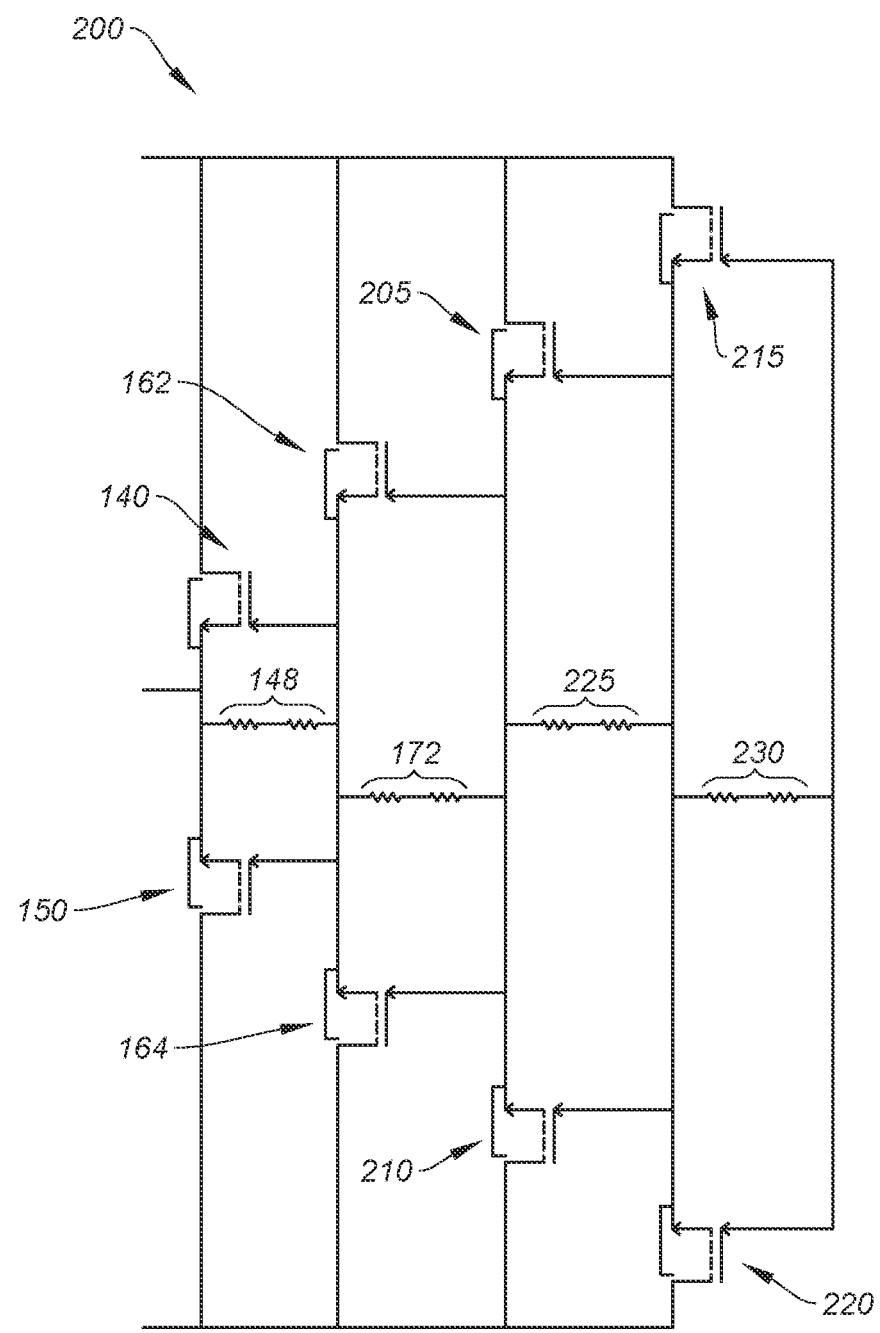
FIG. 2A illustrates a schematic illustration of a clamping circuit according to an embodiment.
Figure 2B:
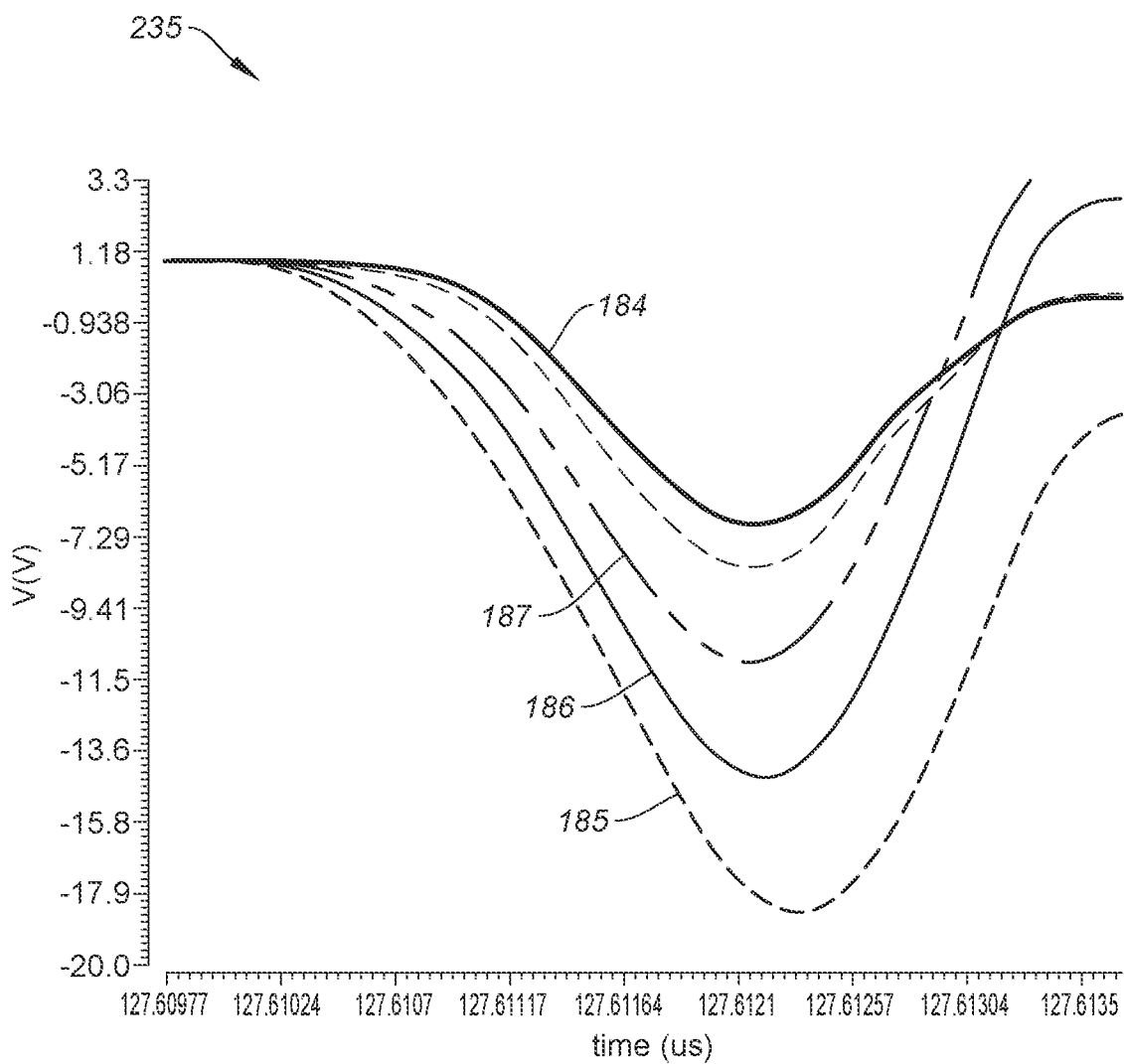
FIGS. 2B illustrates a graph showing operational features of the clamping circuit of FIG. 2A.

FIG. 2B illustrates a mirrored switch circuit 200 that can be used in place of mirrored switch circuit 118 shown in FIG. 1A. Mirrored switch circuit 200 includes eight transistors as compared to mirrored switch circuit 118 of FIG. 1A that includes four transistors. More specifically, mirrored switch circuit 200 includes third transistor 140, fourth transistor 150, fifth transistor 162 and sixth transistor 164 that operate the same as described in FIG. 1A, however mirrored switch circuit 200 also includes a seventh transistor 205, an eighth transistor 210, a ninth transistor 215 and a tenth transistor 220. As explained above, the switches can be arranged in mirrored pairs where each additional pair has transistors with decreasing active areas that enable the transistors to turn on faster to activate third transistor 140 or fourth transistor 150 to turn on and clamp the substrate voltage at a faster rate. With the addition of each switch stage, the substrate voltage is clamped earlier resulting in the substrate voltage remaining closer to zero volts. Each pair of mirrored switches may also include additional resistors, as shown in FIG. 2A switch pair seventh transistor 205, eighth transistor 210 includes resistors 225 and switch pair ninth transistor 215, tenth transistor 220 includes resistors 230.

FIG. 2B illustrates an example negative dV/dt operation graph 235 of the operation of clamp circuit 100 that employs mirrored switch circuit 200 of FIG. 2A. As differential voltage 184 of first node 104 with respect to second node 106 decreases, substrate voltage 185 decreases to follow the change in voltage. However, substrate voltage 185 is clamped due to a voltage at third gate terminal 187 (see FIG. 1A) turning on third transistor 140 and clamping substrate 185 to a voltage of first node 104 minus one threshold voltage of third transistor 140. A voltage at fifth gate terminal 186 is also shown which assists with the turning on of third transistor 140, as explained above. Further a gate voltage of seventh transistor 240 and a gate voltage of ninth transistor 245 are shown. These additional switch pairs clamp substrate voltage 185 faster than the clamp circuit 100 shown in FIG. 1A, thus the substrate voltage in FIG. 2B is only approximately −18 Volts as compared to substrate voltage in FIG. 1D which is approximately −55 Volts. The addition of more mirrored transistor stages will further reduce the deviation of the substrate voltage deviation from zero volts during negative dV/dt events.

This disclosure is not limited to the circuits described above and includes any circuit that controls a voltage of a semiconductor substrate on which one or more semiconductor devices are formed. The following figures describe various circuits that can be used to control a voltage of a semiconductor substrate.

Figure 2C:
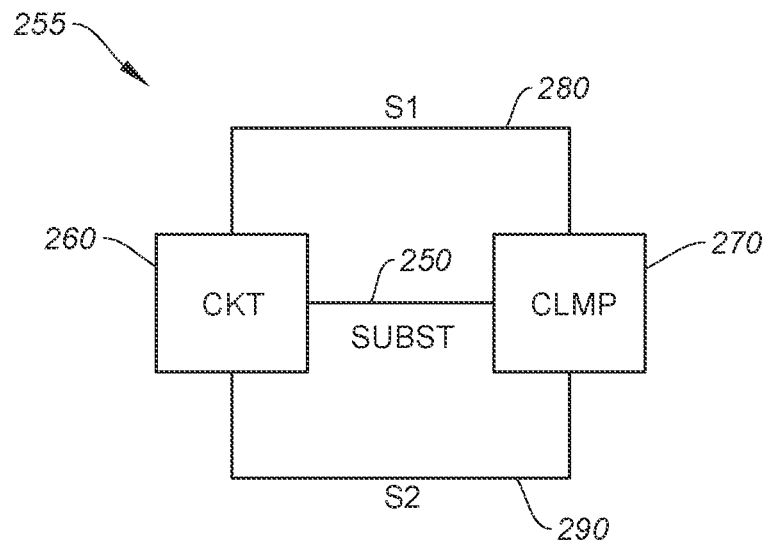
FIG. 2C illustrates a schematic illustration of an electrical system according to an embodiment.

FIG. 2C illustrates a schematic illustration of an electrical system 255 having a first circuit CKT 260 and a clamping circuit CLMP system 270 according to a first embodiment.

As illustrated, electrical system 255 includes first circuit 260, clamping circuit system 270, first node S1 280, second node S2 290, and substrate SUBST 250.

First circuit 260 may be any circuit. For example, first circuit 260 may be an instantiation of either of the circuits 1000 and 1100, illustrated with reference to FIGS. 10 and 11.

First circuit 260 may have input terminals and output terminals, and may be configured to generate signals at its output terminals based on signals received at its input terminals, and based on, for example, power supply or ground voltages. In some embodiments, first node 280 is an input terminal and/or an output terminal of first circuit 260. Similarly, in some embodiments, second node 290 is an input terminal and/or an output terminal of first circuit 260. In alternative embodiments, one or both of first node 280 and second node 290 is not an input terminal or an output terminal of first circuit 260. For example, either or both of first node 280 and second node 290 may be a power or ground connection for first circuit 260.

First circuit 260 is also connected to substrate 250. In some embodiments substrate 250 can be a semiconductor substrate comprising gallium nitride (GaN), silicon or other semiconducting material. In one embodiments first circuit 260 may be monolithically formed on substrate 250 comprising GaN. As understood by those of skill in the art, a voltage of the substrate 250 may affect the operational performance of the first circuit 260. For example, transistor threshold voltages, conduction impedance, leakage, and other electrical parameters of first circuit 260 may be partly dependent on the voltage of substrate 250.

In some embodiments, circuit activity of circuits formed on substrate 250 may cause transitions in the voltage of substrate 250. For example, circuits formed on substrate 250 may inject or remove charge to or from substrate 250, or may capacitively couple charge to or from substrate 250. In addition, circuits formed on substrate 250 may cause transitions in the voltage of substrate 250 using other mechanisms known to those of skill in the art.

For example, transitions in the voltage of substrate 250 may occur as a result of the voltage at the first node 280 increasing or decreasing with respect to the voltage the second node 290, where either or both of the voltages at the first and second nodes 280 and 290 increase or decrease with respect to a ground voltage or with respect to the voltage of substrate 250. Similarly, transitions in the voltage of substrate 250 may occur as a result of the voltage at the first node 280 increasing or decreasing with respect to the voltage of substrate 250 and as a result of the voltage at the second node 290 increasing or decreasing with respect to the voltage of substrate 250.

Furthermore, transitions occurring in the voltage of substrate 250 may be temporary. Accordingly, the electrical parameters of elements of first circuit 260 may correspondingly change in response to the voltage transitions, and may therefore be inconsistent over time. Clamping circuit system 270 is configured to reduce or eliminate voltage excursions of the substrate 250. In some embodiments, clamping circuit system 270 includes multiple clamping circuits, each configured to reduce or eliminate the voltage excursions of the substrate 250.

In some embodiments, one or more first clamping circuits (not shown in FIG. 1) of clamping circuit system 270 are configured to reduce or eliminate positive voltage excursions with respect to either or both of the first and second nodes 280 and 290, respectively. For example, one or more first clamping circuits may have features similar or identical to clamping circuit 200, illustrated with reference to FIG. 2D.

In some embodiments, one or more second clamping circuits of clamping circuit system 270 are configured to reduce or eliminate negative voltage excursions with respect to either or both of the first and second nodes 280 and 290. For example, one or more second clamping circuits may have features similar or identical to any of clamping circuits 300-800, illustrated with reference to FIGS. 3-8. Because of the reduced or eliminated voltage excursions of substrate 250, the operational performance of first circuit 260 can be improved.

Figure 2D:
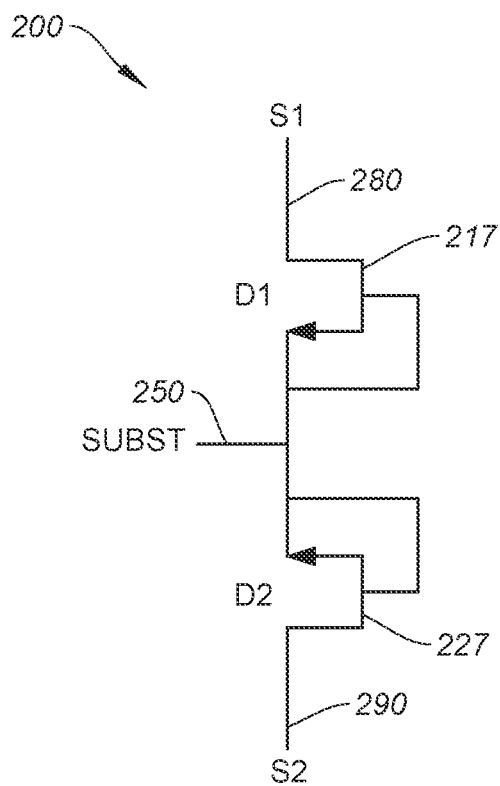
FIG. 2D illustrates a schematic illustration of a clamping circuit according to a first embodiment.

FIG. 2D shows a schematic illustration of one embodiment of a clamping circuit 200 that can be used in clamping circuit system 270 of FIG. 2C. Clamping circuit 200 is configured to reduce or eliminate positive excursions in the voltage of substrate 250 (see FIG. 2C) with respect to either or both of the first and second nodes 280 and 290, as explained in more detail below.

As shown in FIG. 2D, clamping circuit 200 includes first diode D1 217, second diode D2 227, first node S1 280, second node S2 290, and substrate SUBST 250. Clamping circuit 200 may be used as, or as at least part of some embodiments of clamping circuit system 270 of FIG. 2C. Clamping circuit 200 may be used as, or as at least part of other circuits, and clamping circuit system 270 may additionally or alternatively use other clamping circuits.

First and second diodes 217 and 227, respectively, may each be any type of suitable diode. For example, either of first and second diodes 217 and 227, respectively, may be any of a diode-connected field-effect transistor, a Schottky diode, a Zener diode, or any type of p-n junction diode. In some embodiments, first and second diodes 217 and 227, respectively, are similar or identical to one another. In alternative embodiments, first and second diodes 217 and 227, respectively, are different types of diodes. In further embodiments first and second diodes 217 and 227, respectively, are monolithically formed on a semiconductor substrate that includes one or more power transistors.

First diode 217 is illustrated in FIG. 2 as a diode-connected FET having an anode terminal connected to substrate 250 and a cathode terminal connected to first node 280. Second diode 227 is illustrated in FIG. 2 as a diode-connected FET having an anode terminal connected to substrate 250 and a cathode terminal connected to second node 290. In response to a positive voltage excursion in the voltage of substrate 250 with respect to first node 280, first diode 217 may become conductive so as to clamp the voltage of substrate 250 to one diode voltage drop of first diode 217 greater than the voltage at first node 280. Similarly, in response to a positive voltage excursions in the voltage of substrate 250 with respect to second node 290, second diode 227 may become conductive so as to clamp the voltage of substrate 250 to one diode voltage drop of second diode 217 greater than the voltage at second node 280.

Figure 3:
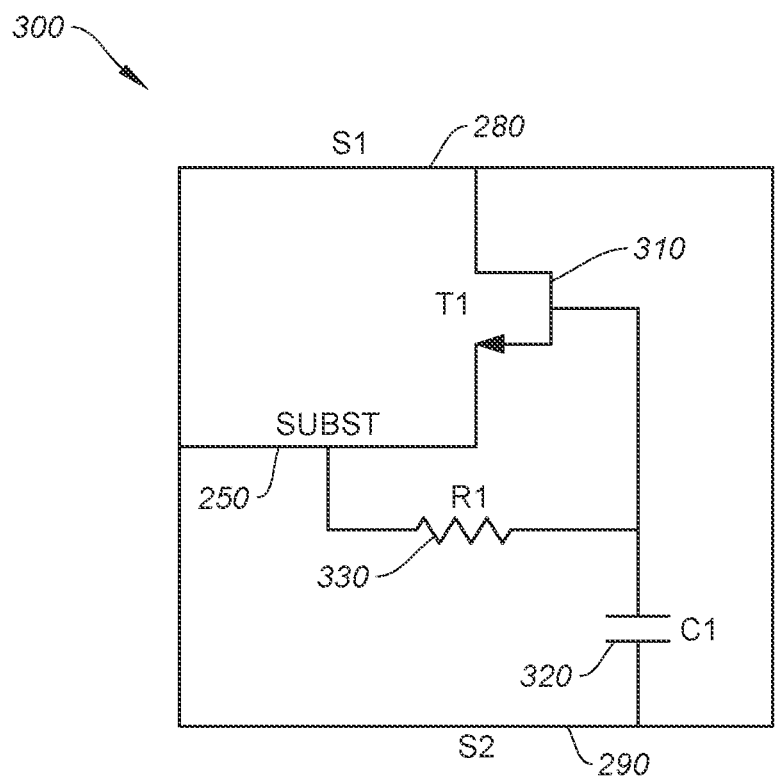
FIG. 3 illustrates a schematic illustration of a clamping circuit according to a second embodiment.

FIG. 3 illustrates a schematic illustration of a clamping circuit 300 according to a second embodiment. Clamping circuit 300 is configured to reduce or eliminate negative excursions in the voltage of substrate 250 with respect to either or both of the first and second nodes 280 and 290. As illustrated, clamping circuit 300 includes first transistor T1 310, first capacitor C1 320, first resistor R1, and substrate SUBST 250. Clamping circuit 300 may be used as, or as at least part of some embodiments of clamping circuit system 270 of FIG. 2C. Clamping circuit 300 may be used as, or as at least part of other circuits, and clamping circuit system 270 may additionally or alternatively use other clamping circuits.

First transistor 310 may be any type of transistor. For example, first transistor 310 may be a FET formed on the substrate 250, where the substrate 250 comprises, for example, GaN. Alternative types of transistors or switches known to those of skill in the art may be used as first transistor 310. In the embodiment of FIG. 3, first transistor 310 includes a drain terminal electrically connected with first node 280, and a source terminal electrically connected with substrate 250 and with first resistor 330. Furthermore, in the embodiment of FIG. 3, first transistor 310 includes a gate terminal electrically connected with first capacitor 320 and with first resistor 330.

First capacitor 320 may be any type of capacitor. For example, first capacitor 320 may be an integrated capacitor formed on the substrate 250 using techniques and materials known to those of skill in the art. In alternative embodiments, first capacitor 320 is not formed on substrate 250, and is electrically connected to first transistor 310 and first resistor 330 using techniques known to those of skill in the art. In the embodiment of FIG. 3, first capacitor 320 includes a first terminal electrically connected with the gate terminal of first transistor 310 and with first resistor 330. Furthermore, in the embodiment of FIG. 3, first capacitor 320 includes a second terminal electrically connected with second node 290.

First resistor 330 may be any type of resistor. For example, first resistor 330 may be an integrated resistor, formed on the substrate 250 using techniques and materials known to those of skill in the art. In alternative embodiments, first resistor 330 is not formed on substrate 250, and is electrically connected to first transistor 310 and first capacitor 320 using techniques known to those of skill in the art. In the embodiment of FIG. 3, first resistor 330 includes a first terminal electrically connected with the gate terminal of transistor 310 and with the first terminal of capacitor 320. Furthermore, first resistor 330 includes a second terminal electrically connected with the substrate 250 and the source terminal of first transistor 310.

In response to a negative voltage transition in the voltage of substrate 250 with respect to first node 280, the voltage at the gate terminal of first transistor 310 experiences a delayed negative voltage transition, where the delayed negative voltage transition is delayed with respect to the negative voltage transition in the voltage of substrate 250 with respect to first node 280. A negative voltage transition in the voltage of substrate 250 with respect to first node 280 may occur, for example, as a result of the voltage at the first node 280 increasing with respect to the voltage of substrate 250. Furthermore, a negative voltage transition in the voltage of substrate 250 with respect to first node 280 may occur, for example, as a result of the voltage at the first node 280 increasing with respect to the voltage of the second node 290.

The delayed negative voltage transition at the gate terminal of first transistor 310 occurs because the voltage at the gate terminal of first transistor 310 is determined based on the negative voltage transition in the voltage of substrate 250 with respect to the first node 280, the resistance of first resistor 330, and the capacitance of the node shared by the gate terminal of first transistor 310 and the first terminal of first capacitor 320, as understood by those of skill in the art, where the capacitance of the node shared by the gate terminal of first transistor 310 and the first terminal of the first capacitor 320 includes the capacitance of first capacitor 320. In some embodiments, the capacitance of the node shared by the gate terminal of first transistor 310 and the first terminal of first capacitor 320 is dominated by the capacitance of first capacitor 320.

Because the negative voltage transition at the gate terminal of first transistor 310 is delayed with respect to the negative voltage transition in the voltage of substrate 250, the gate to source voltage Vgs of first transistor 310 increases. Accordingly, a negative transition in the voltage of substrate 250 with respect to first node 280 may cause the Vgs of first transistor 310 to increase such that first transistor 310 becomes conductive. In response to first transistor 310 becoming conductive, first transistor 310 conducts charge from first node 280 to the substrate 250. Because of the charge conducted to the substrate 250, the magnitude of the negative voltage transition in the voltage of substrate 250 with respect to first node 280 is reduced.

In some embodiments, first transistor 310, first capacitor 320, and first resistor 330 are sized such that the magnitude of negative voltage transitions at the gate terminal of first transistor 310 are clamped by clamping circuit 300 to no more than about one threshold voltage of first transistor 310. In circumstances when the voltage of the substrate 250 stops changing, the voltage at the node shared by the gate terminal of first transistor 310 and the first terminal of first capacitor 320 becomes equal to the voltage of the substrate 250 according to the resistance of first resistor 330, and the capacitance of the node shared by the gate terminal of first transistor 310 and the first terminal of first capacitor 320, as understood by those of skill in the art.

Figure 4:
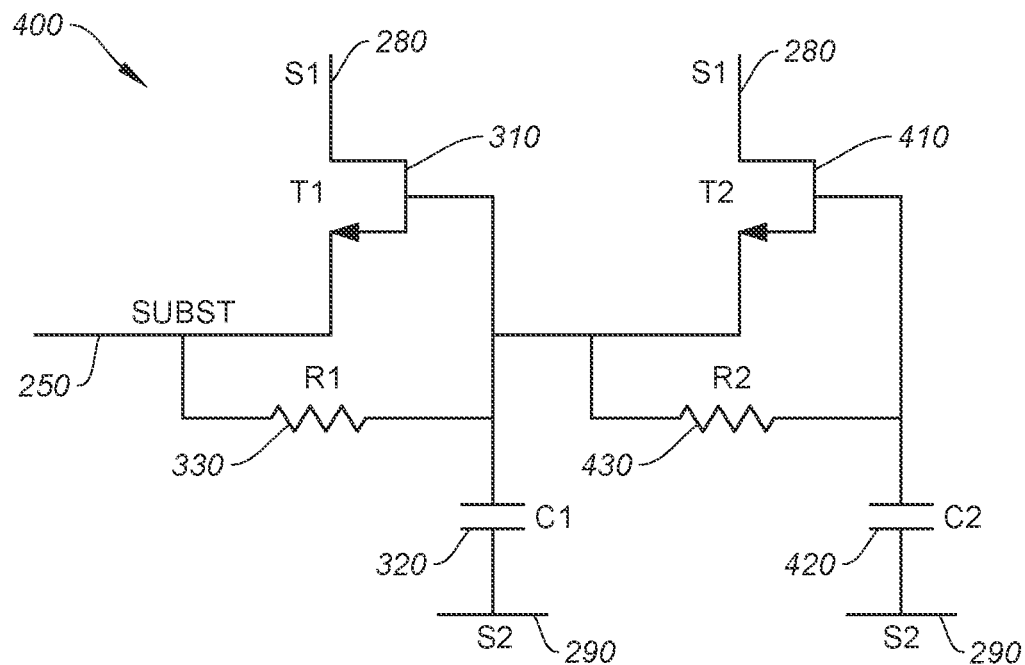
FIG. 4 illustrates a schematic illustration of a clamping circuit according to a third embodiment.

FIG. 4 illustrates a schematic illustration of a clamping circuit 400 according to a third embodiment. Clamping circuit 400 is configured to reduce or eliminate negative excursions in the voltage of substrate 250 with respect to either or both of the first and second nodes 280 and 290. As illustrated, in addition to the components described above with reference to clamping circuit 300 of FIG. 3, clamping circuit 400 includes second transistor T2 410, second capacitor C2 420, and second resistor R2. Clamping circuit 400 may be used as, or as at least part of some embodiments of clamping circuit system 270 of FIG. 2C. Clamping circuit 400 may be used as, or as at least part of other circuits, and clamping circuit system 270 may additionally or alternatively use other clamping circuits.

Second transistor 410 may be any type of transistor. For example, second transistor 410 may be a FET formed on the substrate 250, where the substrate 250 comprises, for example, GaN. Alternative types of transistors or switches known to those of skill in the art may be used as second transistor 410. In the embodiment of FIG. 4, second transistor 410 includes a drain terminal electrically connected with first node 280, and a source terminal electrically connected with second resistor 430 and with the node shared by the gate terminal of first transistor 310 and the first terminal of first capacitor 320. Furthermore, in the embodiment of FIG. 4, second transistor 410 includes a gate terminal electrically connected with second capacitor 420 and with second resistor 430.

Second capacitor 420 may be any type of capacitor. For example, second capacitor 420 may be an integrated capacitor formed on the substrate 250 using techniques and materials known to those of skill in the art. In alternative embodiments, second capacitor 420 is not formed on substrate 250, and is electrically connected to second transistor 410 and second resistor 430 using techniques known to those of skill in the art. In the embodiment of FIG. 4, second capacitor 420 includes a first terminal electrically connected with the gate terminal of second transistor 410 and with second resistor 430. Furthermore, in the embodiment of FIG. 4, second capacitor 420 includes a second terminal electrically connected with second node 290.

Second resistor 430 may be any type of resistor. For example, second resistor 430 may be an integrated resistor, formed on the substrate 250 using techniques and materials known to those of skill in the art. In alternative embodiments, second resistor 430 is not formed on substrate 250, and is electrically connected to second transistor 410 and second capacitor 420 using techniques known to those of skill in the art.

In the embodiment of FIG. 4, second resistor 430 includes a first terminal electrically connected with the gate terminal of transistor 410 and with the first terminal of capacitor 420. Furthermore, second resistor 430 includes a second terminal electrically connected with the source terminal of second transistor 410 and with the node shared by the gate terminal of first transistor 310 and the first terminal of first capacitor 320.

In response to a negative voltage transition in the voltage of substrate 250 with respect to first node 280, the voltage at the gate terminal of first transistor 310 experiences a delayed negative voltage transition, where the delayed negative voltage transition is delayed with respect to the negative voltage transition in the voltage of substrate 250 with respect to first node 280. This occurs because the voltage at the gate terminal of first transistor 310 is determined based on the negative voltage transition in the voltage of substrate 250 with respect to the first node 280, the resistance of first resistor 330, and the capacitance of the node shared by the gate terminal of first transistor 310 and the first terminal of first capacitor 320, as understood by those of skill in the art, where the capacitance of the node shared by the gate terminal of first transistor 310 and the first terminal of the first capacitor 320 includes the capacitance of first capacitor 320. In some embodiments, the capacitance of the node shared by the gate terminal of first transistor 310 and the first terminal of first capacitor 320 is dominated by the capacitance of first capacitor 320.

Because the negative voltage transition at the gate terminal of first transistor 310 is delayed with respect to the negative voltage transition in the voltage of substrate 250, the gate to source voltage Vgs of first transistor 310 increases. Accordingly, a negative transition in the voltage of substrate 250 with respect to first node 280 may cause the Vgs of first transistor 310 to increase such that first transistor 310 becomes conductive. In response to first transistor 310 becoming conductive, first transistor 310 conducts charge from first node 280 to the substrate 250. Because of the charge conducted to the substrate 250, the magnitude of the negative voltage transition in the voltage of substrate 250 with respect to first node 280 is reduced.

In response to the negative voltage transition at the node shared by the gate terminal of first transistor 310 and the first terminal of first capacitor 320, the voltage at the gate terminal of second transistor 410 experiences a delayed negative voltage transition, where the delayed negative voltage transition is delayed with respect to the negative voltage transition in the voltage at the node shared by the gate terminal of first transistor 310 and the first terminal of first capacitor 320. This occurs because the voltage at the gate terminal of second transistor 410 is determined based on the negative voltage transition at the node shared by the gate terminal of first transistor 310 and the first terminal of first capacitor 320, the resistance of second resistor 430, and the capacitance of the node shared by the gate terminal of second transistor 410 and the first terminal of second capacitor 420, as understood by those of skill in the art, where the capacitance of the node shared by the gate terminal of second transistor 410 and the first terminal of the second capacitor 420 includes the capacitance of second capacitor 420. In some embodiments, the capacitance of the node shared by the gate terminal of second transistor 410 and the first terminal of second capacitor 420 is dominated by the capacitance of second capacitor 420.

Because the negative voltage transition at the gate terminal of second transistor 410 is delayed with respect to the negative voltage transition in the voltage at the node shared by the gate terminal of first transistor 310 and the first terminal of first capacitor 320, the gate to source voltage Vgs of second transistor 410 increases. Accordingly, a negative transition in the voltage of substrate 250 with respect to first node 280 may cause the Vgs of second transistor 410 to increase such that second transistor 410 becomes conductive. In response to second transistor 410 becoming conductive, second transistor 410 conducts charge from first node 280 to the node shared by the gate terminal of first transistor 310 and the first terminal of first capacitor 320. Because of the charge conducted to the node shared by the gate terminal of first transistor 310 and the first terminal of first capacitor 320, the gate to source voltage Vgs of first transistor 310 increases. Furthermore, because of the increase in the Vgs of first transistor 310, first transistor 310 becomes more conductive, and conducts additional charge from first node 280 to the substrate 250. Because of the additional charge conducted to the substrate 250, the magnitude of the negative voltage transition in the voltage of substrate 250 with respect to first node 280 is further reduced.

In some embodiments, first transistor 310, first capacitor 320, first resistor 330, second transistor 410, second capacitor 420, and second resistor 430 are sized such that the magnitude of negative voltage transitions at the gate terminal of second transistor 410 are clamped by clamping circuit 400 to no more than about one threshold voltage of second transistor 410. In circumstances when the voltage of the substrate 250 stops changing, the voltage at the node shared by the gate terminal of first transistor 310 and the first terminal of first capacitor 320, and the voltage at the node shared by the gate terminal of second transistor 410 and the first terminal of second capacitor 420 become equal to the voltage of the substrate 250 according to the resistance of first resistor 330, the capacitance of the node shared by the gate terminal of first transistor 310 and the first terminal of first capacitor 320, the resistance of second resistor 430, and the capacitance of the node shared by the gate terminal of second transistor 410 and the first terminal of second capacitor 420, as understood by those of skill in the art.

In alternative embodiments, one or more additional sets of components are included, where each set of components comprises a transistor, a capacitor, and a resistor, electrically connected to one another in a configuration similar or identical to the connection configuration of first transistor 310, first capacitor 320, and first resistor 330 illustrated in FIG. 3, and where the source of the transistor of each additional set of components is connected to the gate of the transistor of each previous set of components. In these alternative embodiments, each of the one or more additional sets of components operates, with respect to the previous set of components to which it is connected, similarly or identically as the set of components including second transistor 410, second capacitor 420, and second resistor 430 operates with respect to its previous set of components comprising first transistor 310, first capacitor 320, and first resistor 330, as described above with reference to FIG. 4. In some embodiments, there are two additional sets of components.

Figure 5:
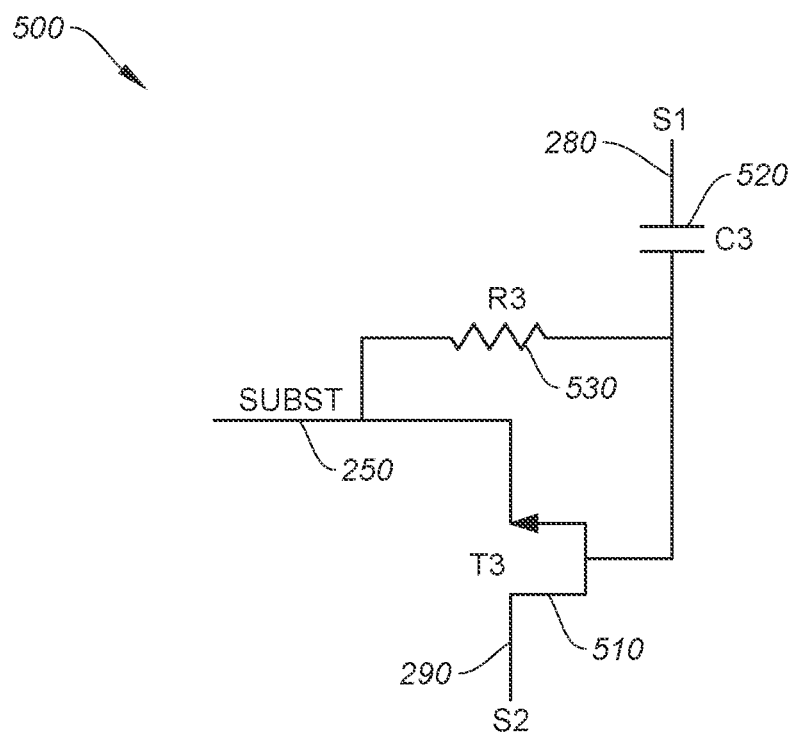
FIG. 5 illustrates a schematic illustration of a clamping circuit according to a fourth embodiment.

FIG. 5 illustrates a schematic illustration of a clamping circuit 500 according to a fourth embodiment. Clamping circuit 300 is configured to reduce or eliminate negative excursions in the voltage of substrate 250 with respect to either or both of the first and second nodes 280 and 290. As illustrated, clamping circuit 500 includes third transistor T3 510, third capacitor C3 520, third resistor R3, and substrate SUBST 250. Clamping circuit 500 may be used as, or as at least part of some embodiments of clamping circuit system 270 of FIG. 2C. Clamping circuit 500 may be used as, or as at least part of other circuits, and clamping circuit system 270 may additionally or alternatively use other clamping circuits.

Third transistor 510 may be any type of transistor. For example, third transistor 510 may be a FET formed on the substrate 250, where the substrate 250 comprises, for example, GaN. Alternative types of transistors or switches known to those of skill in the art may be used as third transistor 510. In the embodiment of FIG. 5, third transistor 510 includes a drain terminal electrically connected with second node 290, and a source terminal electrically connected with substrate 250 and with third resistor 530. Furthermore, in the embodiment of FIG. 5, third transistor 510 includes a gate terminal electrically connected with third capacitor 520 and with third resistor 530. Third capacitor 520 may be any type of capacitor. For example, third capacitor 520 may be an integrated capacitor formed on the substrate 250 using techniques and materials known to those of skill in the art. In alternative embodiments, third capacitor 520 is not formed on substrate 250, and is electrically connected to third transistor 510 and third resistor 530 using techniques known to those of skill in the art.

In the embodiment of FIG. 5, third capacitor 520 includes a first terminal electrically connected with the gate terminal of third transistor 510 and with third resistor 530. Furthermore, in the embodiment of FIG. 5, third capacitor 520 includes a second terminal electrically connected with first node 280. Third resistor 530 may be any type of resistor. For example, third resistor 530 may be an integrated resistor, formed on the substrate 250 using techniques and materials known to those of skill in the art. In alternative embodiments, third resistor 530 is not formed on substrate 250, and is electrically connected to third transistor 510 and third capacitor 520 using techniques known to those of skill in the art.

In the embodiment of FIG. 5, third resistor 530 includes a first terminal electrically connected with the gate terminal of transistor 510 and with the first terminal of capacitor 520. Furthermore, third resistor 530 includes a second terminal electrically connected with the substrate 250 and the source terminal of third transistor 510. In response to a negative voltage transition in the voltage of substrate 250 with respect to second node 290, the voltage at the gate terminal of third transistor 510 experiences a delayed negative voltage transition, where the delayed negative voltage transition is delayed with respect to the negative voltage transition in the voltage of substrate 250 with respect to second node 290.

A negative voltage transition in the voltage of substrate 250 with respect to second node 290 may occur, for example, as a result of the voltage at the second node 290 increasing with respect to the voltage of substrate 250. Furthermore, a negative voltage transition in the voltage of substrate 250 with respect to second node 290 may occur, for example, as a result of the voltage at the second node 290 increasing with respect to the voltage of the first node 280.

The delayed negative voltage transition at the gate terminal of third transistor 510 occurs because the voltage at the gate terminal of third transistor 510 is determined based on the negative voltage transition in the voltage of substrate 250 with respect to the second node 290, the resistance of third resistor 530, and the capacitance of the node shared by the gate terminal of third transistor 510 and the first terminal of third capacitor 520, as understood by those of skill in the art, where the capacitance of the node shared by the gate terminal of third transistor 510 and the first terminal of the third capacitor 520 includes the capacitance of third capacitor 520. In some embodiments, the capacitance of the node shared by the gate terminal of third transistor 510 and the first terminal of third capacitor 520 is dominated by the capacitance of third capacitor 520.

Because the negative voltage transition at the gate terminal of third transistor 510 is delayed with respect to the negative voltage transition in the voltage of substrate 250, the gate to source voltage Vgs of third transistor 510 increases. Accordingly, a negative transition in the voltage of substrate 250 with respect to second node 290 may cause the Vgs of third transistor 510 to increase such that third transistor 510 becomes conductive. In response to third transistor 510 becoming conductive, third transistor 510 conducts charge from second node 290 to the substrate 250. Because of the charge conducted to the substrate 250, the magnitude of the negative voltage transition in the voltage of substrate 250 with respect to second node 290 is reduced.

Figure 6:
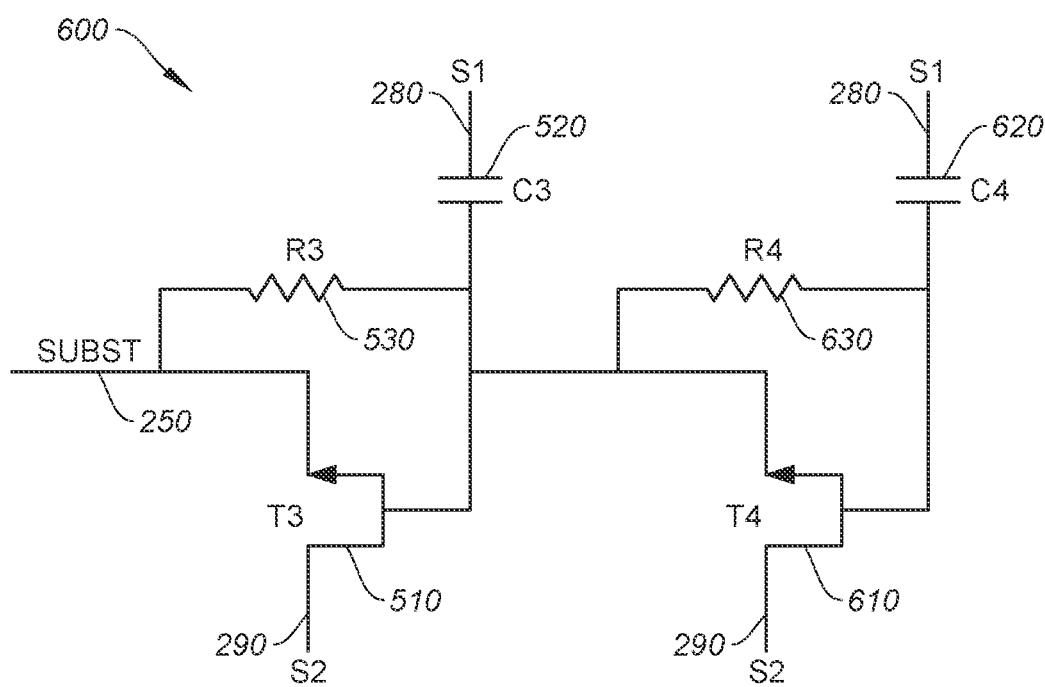
FIG. 6 illustrates a schematic illustration of a clamping circuit according to a fifth embodiment.

In some embodiments, third transistor 510, third capacitor 520, and third resistor 530 are sized such that the magnitude of negative voltage transitions at the gate terminal of third transistor 510 are clamped by clamping circuit 500 to no more than about one threshold voltage of third transistor 510. In circumstances when the voltage of the substrate 250 stops changing, the voltage at the node shared by the gate terminal of third transistor 510 and the first terminal of third capacitor 520 becomes equal to the voltage of the substrate 250 according to the resistance of third resistor 530, and the capacitance of the node shared by the gate terminal of third transistor 510 and the first terminal of third capacitor 520, as understood by those of skill in the art. FIG. 6 illustrates a schematic illustration of a clamping circuit 600 according to a fifth embodiment. Clamping circuit 600 is configured to reduce or eliminate negative excursions in the voltage of substrate 250 with respect to either or both of the first and second nodes 280 and 290.

As illustrated, in addition to the components described above with reference to clamping circuit 500 of FIG. 5, clamping circuit 600 includes fourth transistor T4 610, fourth capacitor C4 620, and fourth resistor R4. Clamping circuit 600 may be used as, or as at least part of some embodiments of clamping circuit system 270 of FIG. 2C. Clamping circuit 600 may be used as, or as at least part of other circuits, and clamping circuit system 270 may additionally or alternatively use other clamping circuits.

Fourth transistor 610 may be any type of transistor. For example, fourth transistor 610 may be a FET formed on the substrate 250, where the substrate 250 comprises, for example, GaN. Alternative types of transistors or switches known to those of skill in the art may be used as fourth transistor 610. In the embodiment of FIG. 6, fourth transistor 610 includes a drain terminal electrically connected with second node 290, and a source terminal electrically connected with fourth resistor 630 and with the node shared by the gate terminal of third transistor 510 and the first terminal of third capacitor 520. Furthermore, in the embodiment of FIG. 6, fourth transistor 610 includes a gate terminal electrically connected with fourth capacitor 620 and with fourth resistor 630.

Fourth capacitor 620 may be any type of capacitor. For example, fourth capacitor 620 may be an integrated capacitor formed on the substrate 250 using techniques and materials known to those of skill in the art. In alternative embodiments, fourth capacitor 620 is not formed on substrate 250, and is electrically connected to fourth transistor 610 and fourth resistor 630 using techniques known to those of skill in the art.

In the embodiment of FIG. 6, fourth capacitor 620 includes a first terminal electrically connected with the gate terminal of fourth transistor 610 and with fourth resistor 630. Furthermore, in the embodiment of FIG. 6, fourth capacitor 620 includes a second terminal electrically connected with first node 280. Fourth resistor 630 may be any type of resistor. For example, fourth resistor 630 may be an integrated resistor, formed on the substrate 250 using techniques and materials known to those of skill in the art. In alternative embodiments, fourth resistor 630 is not formed on substrate 250, and is electrically connected to fourth transistor 610 and fourth capacitor 620 using techniques known to those of skill in the art.

In the embodiment of FIG. 6, fourth resistor 630 includes a first terminal electrically connected with the gate terminal of transistor 610 and with the first terminal of capacitor 620. Furthermore, fourth resistor 630 includes a second terminal electrically connected with the source terminal of fourth transistor 610 and with the node shared by the gate terminal of third transistor 510 and the first terminal of third capacitor 520.

In response to a negative voltage transition in the voltage of substrate 250 with respect to second node 290, the voltage at the gate terminal of third transistor 510 experiences a delayed negative voltage transition, where the delayed negative voltage transition is delayed with respect to the negative voltage transition in the voltage of substrate 250 with respect to second node 290. This occurs because the voltage at the gate terminal of third transistor 510 is determined based on the negative voltage transition in the voltage of substrate 250 with respect to the second node 290, the resistance of third resistor 530, and the capacitance of the node shared by the gate terminal of third transistor 510 and the first terminal of third capacitor 520, as understood by those of skill in the art, where the capacitance of the node shared by the gate terminal of third transistor 510 and the first terminal of the third capacitor 520 includes the capacitance of third capacitor 520. In some embodiments, the capacitance of the node shared by the gate terminal of third transistor 510 and the first terminal of third capacitor 520 is dominated by the capacitance of third capacitor 520.

Because the negative voltage transition at the gate terminal of third transistor 510 is delayed with respect to the negative voltage transition in the voltage of substrate 250, the gate to source voltage Vgs of third transistor 510 increases. Accordingly, a negative transition in the voltage of substrate 250 with respect to second node 290 may cause the Vgs of third transistor 510 to increase such that third transistor 510 becomes conductive. In response to third transistor 510 becoming conductive, third transistor 510 conducts charge from second node 290 to the substrate 250. Because of the charge conducted to the substrate 250, the magnitude of the negative voltage transition in the voltage of substrate 250 with respect to second node 290 is reduced.

In response to the negative voltage transition at the node shared by the gate terminal of third transistor 510 and the first terminal of third capacitor 520, the voltage at the gate terminal of fourth transistor 610 experiences a delayed negative voltage transition, where the delayed negative voltage transition is delayed with respect to the negative voltage transition in the voltage at the node shared by the gate terminal of third transistor 510 and the first terminal of third capacitor 520. This occurs because the voltage at the gate terminal of fourth transistor 610 is determined based on the negative voltage transition at the node shared by the gate terminal of third transistor 510 and the first terminal of third capacitor 520, the resistance of fourth resistor 630, and the capacitance of the node shared by the gate terminal of fourth transistor 610 and the first terminal of fourth capacitor 620, as understood by those of skill in the art, where the capacitance of the node shared by the gate terminal of fourth transistor 610 and the first terminal of the fourth capacitor 620 includes the capacitance of fourth capacitor 620. In some embodiments, the capacitance of the node shared by the gate terminal of fourth transistor 610 and the first terminal of fourth capacitor 620 is dominated by the capacitance of fourth capacitor 620.

Because the negative voltage transition at the gate terminal of fourth transistor 610 is delayed with respect to the negative voltage transition in the voltage at the node shared by the gate terminal of third transistor 510 and the first terminal of third capacitor 520, the gate to source voltage Vgs of fourth transistor 610 increases. Accordingly, a negative transition in the voltage of substrate 250 with respect to second node 290 may cause the Vgs of fourth transistor 610 to increase such that fourth transistor 610 becomes conductive. In response to fourth transistor 610 becoming conductive, fourth transistor 610 conducts charge from second node 290 to the node shared by the gate terminal of third transistor 510 and the first terminal of third capacitor 520. Because of the charge conducted to the node shared by the gate terminal of third transistor 510 and the first terminal of third capacitor 520, the gate to source voltage Vgs of third transistor 510 increases. Furthermore, because of the increase in the Vgs of third transistor 510, third transistor 510 becomes more conductive, and conducts additional charge from second node 290 to the substrate 250. Because of the additional charge conducted to the substrate 250, the magnitude of the negative voltage transition in the voltage of substrate 250 with respect to second node 290 is further reduced.

In some embodiments, third transistor 510, third capacitor 520, third resistor 530, fourth transistor 610, fourth capacitor 620, and fourth resistor 630 are sized such that the magnitude of negative voltage transitions at the gate terminal of fourth transistor 610 are clamped by clamping circuit 600 to no more than about one threshold voltage of fourth transistor 610. In circumstances when the voltage of the substrate 250 stops changing, the voltage at the node shared by the gate terminal of third transistor 510 and the first terminal of third capacitor 520, and the voltage at the node shared by the gate terminal of fourth transistor 610 and the first terminal of fourth capacitor 620 become equal to the voltage of the substrate 250 according to the resistance of third resistor 530, the capacitance of the node shared by the gate terminal of third transistor 510 and the first terminal of third capacitor 520, the resistance of fourth resistor 630, and the capacitance of the node shared by the gate terminal of fourth transistor 610 and the first terminal of fourth capacitor 620, as understood by those of skill in the art.

In alternative embodiments, one or more additional sets of components are included, where each set of components comprises a transistor, a capacitor, and a resistor, electrically connected to one another in a configuration similar or identical to the connection configuration of third transistor 510, third capacitor 520, and third resistor 530 illustrated in FIG. 5, and where the source of the transistor of each additional set of components is connected to the gate of the transistor of each previous set of components. In these alternative embodiments, each of the one or more additional sets of components operates, with respect to the previous set of components to which it is connected, similarly or identically as the set of components including fourth transistor 610, fourth capacitor 620, and fourth resistor 630 operates with respect to its previous set of components comprising third transistor 510, third capacitor 520, and third resistor 530, as described above with reference to FIG. 6. In some embodiments, there are two additional sets of components.

Figure 7:
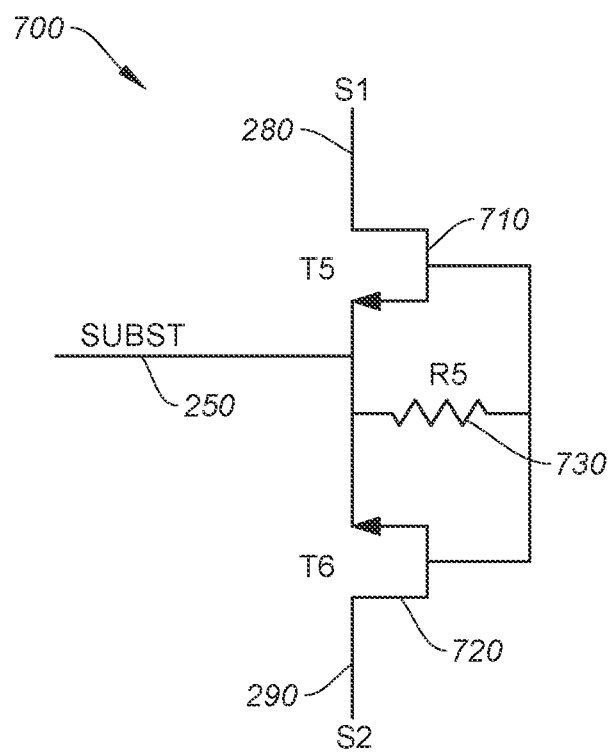
FIG. 7 illustrates a schematic illustration of a clamping circuit according to a sixth embodiment.

FIG. 7 illustrates a schematic illustration of a clamping circuit 700 according to a sixth embodiment. Clamping circuit 700 is configured to reduce or eliminate negative excursions in the voltage of substrate 250 with respect to either or both of the first and second nodes 280 and 290. As illustrated, clamping circuit 700 includes fifth transistor T5 710, sixth transistor T6 720, fifth resistor R1, and substrate SUBST 250. Clamping circuit 700 may be used as, or as at least part of some embodiments of clamping circuit system 270 of FIG. 2C. Clamping circuit 700 may be used as, or as at least part of other circuits, and clamping circuit system 270 may additionally or alternatively use other clamping circuits. Each of fifth and sixth transistors 710 and 720 may be any type of transistor. For example, either or both of fifth and sixth transistors 710 and 720 may be FETs formed on the substrate 250, where the substrate 250 comprises, for example, GaN. Alternative types of transistors or switches known to those of skill in the art may be used as either of both of fifth and sixth transistors 710 and 720.

In the embodiment of FIG. 7, fifth transistor 710 includes a drain terminal electrically connected with first node 280, and a source terminal electrically connected with substrate 250, with fifth resistor 730, and with sixth transistor 720. Furthermore, in the embodiment of FIG. 7, fifth transistor 710 includes a gate terminal electrically connected with fifth resistor 730 and with sixth transistor 720. In the embodiment of FIG. 7, sixth transistor 720 includes a drain terminal electrically connected with second node 290, and a source terminal electrically connected with substrate 250, with fifth resistor 730, and with fifth transistor 710. Furthermore, in the embodiment of FIG. 7, sixth transistor 720 includes a gate terminal electrically connected with fifth resistor 730 and with fifth transistor 710.

Fifth resistor 730 may be any type of resistor. For example, fifth resistor 730 may be an integrated resistor, formed on the substrate 250 using techniques and materials known to those of skill in the art. In alternative embodiments, fifth resistor 730 is not formed on substrate 250, and is electrically connected to fifth and sixth transistors 710 and 720 using techniques known to those of skill in the art. In the embodiment of FIG. 7, fifth resistor 730 includes a first terminal electrically connected with the gate terminals of fifth and sixth transistors 710 and 720, and a second terminal electrically connected with the substrate 250 and the source terminals of fifth and sixth transistors 710 and 720.

In response to a negative voltage transition in the voltage of substrate 250 with respect to first node 280, the voltage at the gate terminal of fifth transistor 710 experiences a delayed negative voltage transition, where the delayed negative voltage transition is delayed with respect to the negative voltage transition in the voltage of substrate 250 with respect to first node 280. A negative voltage transition in the voltage of substrate 250 with respect to first node 280 may occur, for example, as a result of the voltage at the first node 280 increasing with respect to the voltage of substrate 250. Furthermore, a negative voltage transition in the voltage of substrate 250 with respect to first node 280 may occur, for example, as a result of the voltage at the first node 280 increasing with respect to the voltage of the second node 290.

The delayed negative voltage transition at the gate terminal of fifth transistor 710 occurs because the voltage at the gate terminal of fifth transistor 710 is determined based on the negative voltage transition in the voltage of substrate 250 with respect to the first node 280, the resistance of fifth resistor 730, and the capacitance of the node shared by the gate terminals of fifth and sixth transistors 710 and 720, as understood by those of skill in the art.

In some embodiments, the capacitance of the node shared by the gate terminals of fifth and sixth transistors 710 and 720 also includes the capacitance of an additional capacitor (not shown) with a first terminal connected to the node shared by the gate terminals of fifth and sixth transistors 710 and 720, and a second terminal connected to either of the first and second nodes 280 and 290. In some embodiments, the capacitance of the node shared by the gate terminals of fifth and sixth transistors 710 and 720 also includes the capacitance of first and second additional capacitors (not shown) each having a first terminal connected to the node shared by the gate terminals of fifth and sixth transistors 710 and 720, and a second terminal connected to a different one of the first and second nodes 280 and 290.

Because the negative voltage transition at the gate terminal of fifth transistor 710 is delayed with respect to the negative voltage transition in the voltage of substrate 250, the gate to source voltage Vgs of fifth transistor 710 increases. Accordingly, a negative transition in the voltage of substrate 250 with respect to first node 280 may cause the Vgs of fifth transistor 710 to increase such that fifth transistor 710 becomes conductive. In response to fifth transistor 710 becoming conductive, fifth transistor 710 conducts charge from first node 280 to the substrate 250. Because of the charge conducted to the substrate 250, the magnitude of the negative voltage transition in the voltage of substrate 250 with respect to first node 280 is reduced.

In response to a negative voltage transition in the voltage of substrate 250 with respect to second node 290, the voltage at the gate terminal of sixth transistor 720 experiences a delayed negative voltage transition, where the delayed negative voltage transition is delayed with respect to the negative voltage transition in the voltage of substrate 250 with respect to second node 290. A negative voltage transition in the voltage of substrate 250 with respect to second node 290 may occur, for example, as a result of the voltage at the second node 290 increasing with respect to the voltage of substrate 250. Furthermore, a negative voltage transition in the voltage of substrate 250 with respect to second node 290 may occur, for example, as a result of the voltage at the second node 290 increasing with respect to the voltage of the first node 280.

The delayed negative voltage transition at the gate terminal of sixth transistor 720 occurs because the voltage at the gate terminal of sixth transistor 720 is determined based on the negative voltage transition in the voltage of substrate 250 with respect to the second node 290, the resistance of fifth resistor 730, and the capacitance of the node shared by the gate terminals of fifth and sixth transistors 710 and 720, as understood by those of skill in the art. Because the negative voltage transition at the gate terminal of sixth transistor 720 is delayed with respect to the negative voltage transition in the voltage of substrate 250, the gate to source voltage Vgs of sixth transistor 720 increases. Accordingly, a negative transition in the voltage of substrate 250 with respect to second node 290 may cause the Vgs of sixth transistor 720 to increase such that sixth transistor 720 becomes conductive. In response to sixth transistor 720 becoming conductive, sixth transistor 720 conducts charge from second node 290 to the substrate 250. Because of the charge conducted to the substrate 250, the magnitude of the negative voltage transition in the voltage of substrate 250 with respect to second node 290 is reduced.

In some embodiments, fifth and sixth transistors 710 and 720, and fifth resistor 730 are sized such that the magnitude of negative voltage transitions of the substrate 250 with respect to either of the first and second nodes 280 and 290 are clamped by clamping circuit 700 to no more than about one threshold voltage of fifth transistor 710 for negative voltage transitions with respect to first node 280, and to no more than about one threshold voltage of sixth transistor 720 for negative voltage transitions with respect to second node 290.

Furthermore, the magnitude of negative voltage transitions of the substrate 250 with respect to either of the first and second nodes 280 and 290 are clamped by clamping circuit 700 to no more than about one threshold voltage from the lesser of the voltages at first and second nodes 280 and 290. Accordingly, clamping circuit 700 is configured to clamp the voltage of the substrate 250 to no more than about one threshold voltage less than the voltage of the first node 280 if the voltage of the first node 280 is less than the voltage of the second node 290. Similarly, clamping circuit 700 is configured to clamp the voltage of the substrate 250 to no more than about one threshold voltage less than the voltage of the second node 290 if the voltage of the second node 290 is less than the voltage of the first node 280.

In circumstances when the voltage of the substrate 250 stops changing, the voltage at the node shared by the gate terminals of the fifth and sixth transistors 710 and 720 becomes equal to the voltage of the substrate 250 according to the resistance of fifth resistor 730, and the capacitance of the node shared by the gate terminals of the fifth and sixth transistors 710 and 720, as understood by those of skill in the art.

Figure 8:
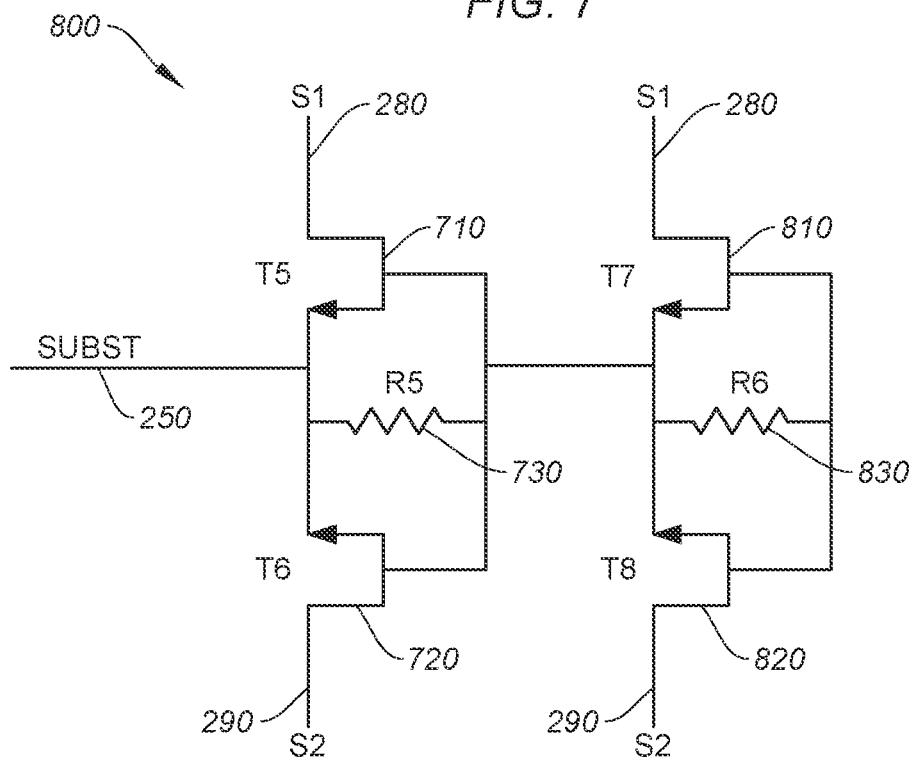
FIG. 8 illustrates a schematic illustration of a clamping circuit according to a seventh embodiment.

FIG. 8 illustrates a schematic illustration of a clamping circuit 800 according to a seventh embodiment. Clamping circuit 800 is configured to reduce or eliminate negative excursions in the voltage of substrate 250 with respect to either or both of the first and second nodes 280 and 290. As illustrated, in addition to the components described above with reference to clamping circuit 700 of FIG. 7, clamping circuit 800 includes seventh transistor T7 810, eighth transistor T8 820, and sixth resistor R6 830. Clamping circuit 800 may be used as, or as at least part of some embodiments of clamping circuit system 270 of FIG. 2C. Clamping circuit 800 may be used as, or as at least part of other circuits, and clamping circuit system 270 may additionally or alternatively use other clamping circuits.

Each of seventh and eight transistors 810 and 820 may be any type of transistor. For example, either or both of seventh and eight transistors 810 and 820 may be FETs formed on the substrate 250, where the substrate 250 comprises, for example, GaN. Alternative types of transistors or switches known to those of skill in the art may be used as either of both of seventh and eight transistors 810 and 820. In the embodiment of FIG. 8, seventh transistor 810 includes a drain terminal electrically connected with first node 280, and a source terminal electrically connected with the gate terminals of fifth and sixth transistors 710 and 720, with fifth and sixth resistors 730 and 830, and with eighth transistor 820. Furthermore, in the embodiment of FIG. 8, seventh transistor 810 includes a gate terminal electrically connected with sixth resistor 830 and with eighth transistor 820.

In the embodiment of FIG. 8, eighth transistor 820 includes a drain terminal electrically connected with second node 290, and a source terminal electrically connected with the gate terminals of fifth and sixth transistors 710 and 720, with fifth and sixth resistors 730 and 830, and with seventh transistor 810. Furthermore, in the embodiment of FIG. 8, eighth transistor 820 includes a gate terminal electrically connected with sixth resistor 830 and with seventh transistor 810.

Sixth resistor 830 may be any type of resistor. For example, sixth resistor 830 may be an integrated resistor, formed on the substrate 250 using techniques and materials known to those of skill in the art. In alternative embodiments, sixth resistor 830 is not formed on substrate 250, and is electrically connected to the other circuit elements using techniques known to those of skill in the art. In the embodiment of FIG. 8, sixth resistor 830 includes a first terminal electrically connected with the gate terminals of seventh and eighth transistors 810 and 820, and a second terminal electrically connected with the gate terminals of fifth and sixth transistors 710 and 720, fifth resistor 730, and the source terminals of seventh and eighth transistors 810 and 820.

In response to a negative voltage transition in the voltage of substrate 250 with respect to first node 280, the voltage at the gate terminal of fifth transistor 710 experiences a delayed negative voltage transition, where the delayed negative voltage transition is delayed with respect to the negative voltage transition in the voltage of substrate 250 with respect to first node 280. The delayed negative voltage transition at the gate terminal of fifth transistor 710 occurs because the voltage at the gate terminal of fifth transistor 710 is determined based on the negative voltage transition in the voltage of substrate 250 with respect to the first node 280, the resistance of fifth resistor 730, and the capacitance of the node shared by the gate terminals of fifth and sixth transistors 710 and 720, as understood by those of skill in the art.

In some embodiments, the capacitance of the node shared by the gate terminals of fifth and sixth transistors 710 and 720 also includes the capacitance of an additional capacitor (not shown) with a first terminal connected to the node shared by the gate terminals of fifth and sixth transistors 710 and 720, and a second terminal connected to either of the first and second nodes 280 and 290. In some embodiments, the capacitance of the node shared by the gate terminals of fifth and sixth transistors 710 and 720 also includes the capacitance of first and second additional capacitors (not shown) each having a first terminal connected to the node shared by the gate terminals of fifth and sixth transistors 710 and 720, and a second terminal connected to a different one of the first and second nodes 280 and 290.

Because the negative voltage transition at the gate terminal of fifth transistor 710 is delayed with respect to the negative voltage transition in the voltage of substrate 250, the gate to source voltage Vgs of fifth transistor 710 increases. Accordingly, a negative transition in the voltage of substrate 250 with respect to first node 280 may cause the Vgs of fifth transistor 710 to increase such that fifth transistor 710 becomes conductive. In response to fifth transistor 710 becoming conductive, fifth transistor 710 conducts charge from first node 280 to the substrate 250. Because of the charge conducted to the substrate 250, the magnitude of the negative voltage transition in the voltage of substrate 250 with respect to first node 280 is reduced.

In response to the delayed negative voltage transition at the gate terminal of fifth transistor 710 and, therefore, at the source terminal of seventh transistor 810, the voltage at the gate terminal of seventh transistor 810 experiences an additionally delayed negative voltage transition, where the additionally delayed negative voltage transition is delayed with respect to the negative voltage transition at the source terminal of seventh transistor 810.

The additionally delayed negative voltage transition at the gate terminal of seventh transistor 810 occurs because the voltage at the gate terminal of seventh transistor 810 is determined based on the negative voltage transition in the voltage at the source terminal of seventh transistor 810, the resistance of sixth resistor 830, and the capacitance of the node shared by the gate terminals of seventh and eighth transistors 810 and 820 and sixth resistor 830, as understood by those of skill in the art.

In some embodiments, the capacitance of the node shared by the gate terminals of seventh and eighth transistors 810 and 820 and sixth resistor 830 also includes the capacitance of an additional capacitor (not shown) with a first terminal connected to the node shared by the gate terminals of seventh and eighth transistors 810 and 820 and sixth resistor 830, and a second terminal connected to either of the first and second nodes 280 and 290. In some embodiments, the capacitance of the node shared by the gate terminals of seventh and eighth transistors 810 and 820 and sixth resistor 830 also includes the capacitance of first and second additional capacitors (not shown) each having a first terminal connected to the node shared by the gate terminals of seventh and eighth transistors 810 and 820 and sixth resistor 830, and a second terminal connected to a different one of the first and second nodes 280 and 290.

Because the negative voltage transition at the gate terminal of seventh transistor 810 is delayed with respect to the negative voltage transition in the voltage at the source terminal of seventh transistor 810, the gate to source voltage Vgs of seventh transistor 810 increases. Accordingly, the negative voltage transitions and their relative timing may cause the Vgs of seventh transistor 810 to increase such that seventh transistor 810 becomes conductive. In response to seventh transistor 810 becoming conductive, seventh transistor 810 conducts charge from first node 280 to the node shared by the source terminals of seventh and eighth transistors 810 and 820. Because of the charge conducted from seventh transistor 810, the Vgs of fifth transistor 710 increases, causing fifth transistor 710 to conduct even more charge to the substrate 250. Because of the additional charge conducted to the substrate 250, the magnitude of the negative voltage transition in the voltage of substrate 250 with respect to first node 280 is further reduced.

In response to a negative voltage transition in the voltage of substrate 250 with respect to second node 290, the voltage at the gate terminal of sixth transistor 720 experiences a delayed negative voltage transition, where the delayed negative voltage transition is delayed with respect to the negative voltage transition in the voltage of substrate 250 with respect to second node 290. The delayed negative voltage transition at the gate terminal of sixth transistor 720 occurs because the voltage at the gate terminal of sixth transistor 720 is determined based on the negative voltage transition in the voltage of substrate 250 with respect to the second node 290, the resistance of fifth resistor 730, and the capacitance of the node shared by the gate terminals of fifth and sixth transistors 710 and 720, as understood by those of skill in the art.

Because the negative voltage transition at the gate terminal of sixth transistor 720 is delayed with respect to the negative voltage transition in the voltage of substrate 250, the gate to source voltage Vgs of sixth transistor 720 increases. Accordingly, a negative transition in the voltage of substrate 250 with respect to second node 290 may cause the Vgs of sixth transistor 720 to increase such that sixth transistor 720 becomes conductive. In response to sixth transistor 720 becoming conductive, sixth transistor 720 conducts charge from second node 290 to the substrate 250. Because of the charge conducted to the substrate 250, the magnitude of the negative voltage transition in the voltage of substrate 250 with respect to second node 290 is reduced.

In response to the delayed negative voltage transition at the gate terminal of sixth transistor 720 and, therefore, at the source terminal of eighth transistor 820, the voltage at the gate terminal of eighth transistor 820 experiences an additionally delayed negative voltage transition, where the additionally delayed negative voltage transition is delayed with respect to the negative voltage transition at the source terminal of eighth transistor 820. The additionally delayed negative voltage transition at the gate terminal of eighth transistor 820 occurs because the voltage at the gate terminal of eighth transistor 820 is determined based on the negative voltage transition in the voltage at the source terminal of eighth transistor 820, the resistance of sixth resistor 830, and the capacitance of the node shared by the gate terminals of seventh and eighth transistors 810 and 820 and sixth resistor 830, as understood by those of skill in the art.

Because the negative voltage transition at the gate terminal of eighth transistor 820 is delayed with respect to the negative voltage transition in the voltage at the source terminal of eighth transistor 820, the gate to source voltage Vgs of eighth transistor 820 increases. Accordingly, the negative voltage transitions and their relative timing may cause the Vgs of eighth transistor 820 to increase such that eighth transistor 820 becomes conductive. In response to eighth transistor 820 becoming conductive, eighth transistor 820 conducts charge from second node 290 to the node shared by the source terminals of seventh and eighth transistors 810 and 820. Because of the charge conducted from eighth transistor 820, the Vgs of sixth transistor 720 increases, causing sixth transistor 720 to conduct even more charge to the substrate 250. Because of the additional charge conducted to the substrate 250, the magnitude of the negative voltage transition in the voltage of substrate 250 with respect to second node 290 is further reduced.

In some embodiments, fifth, sixth, seventh, and eighth transistors 710, 720, 810, and 829, and fifth and sixth resistors 730 and 830 are sized such that the magnitude of negative voltage transitions of the substrate 250 with respect to either of the first and second nodes 280 and 290 are clamped by clamping circuit 800 to no more than about one threshold voltage of fifth transistor 710 for negative voltage transitions with respect to first node 280, and to no more than about one threshold voltage of sixth transistor 720 for negative voltage transitions with respect to second node 290.

Furthermore, the magnitude of negative voltage transitions of the substrate 250 with respect to either of the first and second nodes 280 and 290 are clamped by clamping circuit 800 to no more than about one threshold voltage from the lesser of the voltages at first and second nodes 280 and 290. Accordingly, clamping circuit 700 is configured to clamp the voltage of the substrate 250 to no more than about one threshold voltage less than the voltage of the first node 280 if the voltage of the first node 280 is less than the voltage of the second node 290. Similarly, clamping circuit 700 is configured to clamp the voltage of the substrate 250 to no more than about one threshold voltage less than the voltage of the second node 290 if the voltage of the second node 290 is less than the voltage of the first node 280.

In circumstances when the voltage of the substrate 250 stops changing, the voltage at the node shared by the gate terminals of the fifth and sixth transistors 710 and 720 and the voltage at the node shared by the gate terminals of the seventh and eighth transistors 810 and 829 become equal to the voltage of the substrate 250 according to the resistance of fifth resistor 730, the capacitance of the node shared by the gate terminals of the fifth and sixth transistors 710 and 720, the resistance of sixth resistor 830, and the capacitance of the node shared by the gate terminals of the fifth and sixth transistors 810 and 820, as understood by those of skill in the art.

In alternative embodiments, one or more additional sets of components are included, where each set of components comprises two transistors and a resistor electrically connected to one another in a configuration similar or identical to the connection configuration of fifth transistor 510, sixth transistor 720, and fifth resistor 730 illustrated in FIG. 7, and where the node shared by the sources of the two transistors of each additional set of components is connected to the node shared by the gates of the two transistors of each previous set of components. In these alternative embodiments, each of the one or more additional sets of components operates, with respect to the previous set of components to which it is connected, similarly or identically as the set of components including seventh transistor 810, eighth transistor 820, and sixth resistor 830 operates with respect to its previous set of components comprising fifth transistor 510, sixth transistor 720, and fifth resistor 730, as described above with reference to FIG. 8. In some embodiments, there are two additional sets of components.

Figure 9:
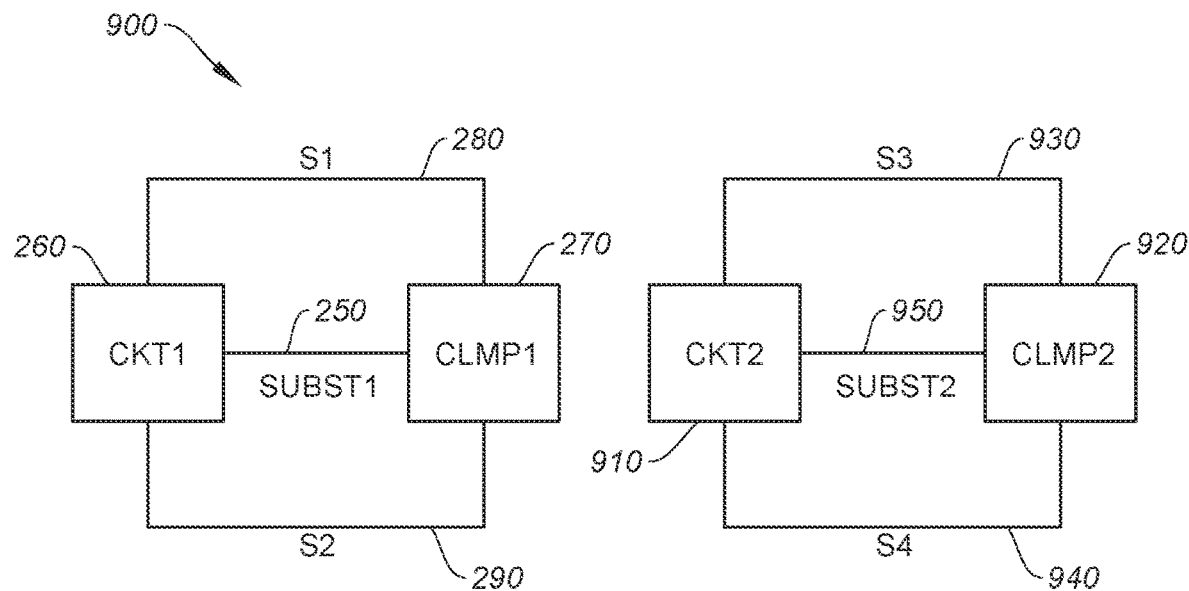
FIG. 9 illustrates a schematic illustration of an electrical system according to an embodiment.

FIG. 9 illustrates a schematic illustration of an electrical system 900 according to an embodiment. As illustrated, electrical system 900 includes first circuit CKT1 260, clamping circuit system CLMP1 270, first node S1 280, second node S2 290, substrate SUBST1 250, second circuit CKT2 910, second clamping circuit system CLMP2 920, third node S3 930, fourth node S4 940, and second substrate SUBST2 950. First circuit 260 may be any circuit, and has features described above with reference to FIG. 2C. In addition, first clamping circuit system 270 may be any clamping circuit system, and has features described above with reference to FIG. 2C.

Second circuit 910 may be any circuit. For example, second circuit 910 may have input terminals and output terminals, and may be configured to generate signals at its output terminals based on signals received at its input terminals, and based on power supply or ground voltages. In some embodiments, third node 930 is an input terminal and/or an output terminal of second circuit 910. Similarly, in some embodiments, fourth node 940 is an input terminal and/or an output terminal of second circuit 910. In alternative embodiments, one or both of third node 930 and fourth node 940 is not an input terminal or an output terminal of second circuit 910. For example, either or both of third node 930 and fourth node 940 may be a power or ground connection for second circuit 910.

Second circuit 910 is also connected to second substrate 950. For example, a second circuit 910 may be monolithically formed on a semiconductor substrate, for example comprising gallium nitride (GaN). As understood by those of skill in the art, the substrate voltage of the second substrate 950 affects the operational performance of the second circuit 910. For example, transistor threshold voltages, conduction impedance, leakage, and other electrical parameters may be partly dependent on the voltage of substrate 950. Circuit activity of circuits formed on second substrate 950 may cause the transitions in the voltage of second substrate 950. For example, circuits formed on second substrate 950 may inject or remove charge to or from second substrate 950, or may capacitively couple charge to or from second substrate 950. In addition, circuits formed on second substrate 950 may cause transitions in the voltage of second substrate 950 using other mechanisms known to those of skill in the art.

For example, transitions in the voltage of second substrate 950 may occur as a result of the voltage at the third node 930 increasing or decreasing with respect to the voltage the fourth node 940, where either or both of the voltages at the first and second nodes 930 and 940 increase or decrease with respect to a ground voltage or with respect to the voltage of second substrate 950. Similarly, transitions in the voltage of second substrate 950 may occur as a result of the voltage at the third node 930 increasing or decreasing with respect to the voltage of second substrate 950 and as a result of the voltage at the fourth node 940 increasing or decreasing with respect to the voltage of second substrate 950.

Furthermore, transitions occurring in the voltage of second substrate 950 may be temporary. Accordingly, the electrical parameters of second circuit 910 would correspondingly change in response to the voltage transitions, and would therefore be inconsistent over time. Second clamping circuit system 920 is configured to reduce or eliminate voltage excursions of the second substrate 950. In some embodiments, second clamping circuit system 920 includes multiple clamping circuits, each configured to reduce or eliminate the voltage excursions.

In some embodiments, one or more first clamping circuits of second clamping circuit system 920 are configured to reduce or eliminate positive voltage excursions with respect to either or both of the first and second nodes 930 and 940. For example, one or more first clamping circuits may have features similar or identical to clamping circuit 200, illustrated with reference to FIG. 2. In some embodiments, one or more second clamping circuits of second clamping circuit system 920 are configured to reduce or eliminate negative voltage excursions with respect to either or both of the first and second nodes 930 and 940. For example, one or more second clamping circuits may have features similar or identical to any of clamping circuits 300-800, illustrated with reference to FIGS. 3-8. Because of the reduced or eliminated voltage excursions of second substrate 950, the operational performance of second circuit 910 can be improved.

In some embodiments, first and second substrates 250 and 950 are different substrates. For example, first and second substrates 250 and 950 may be different and may be packaged within a single integrated circuit (IC) package having, for example, mechanical and electrical connections for each of the first and second substrates 250 and 950. In some embodiments, first and second substrates are electrically connected to one another, at least partly by electrically conductive elements within the IC package. In some embodiments, first and second substrates 250 and 950 are different portions of a single unitary substrate, for example, comprising a semiconductor. In some embodiments, first node 280 is electrically connected or shorted with third node 930. In some embodiments, second node 290 is electrically connected or shorted with fourth node 940. In some embodiments, one or more of the inputs and/or one or more of the outputs of first circuit 260 are electrically connected with one or more of the inputs and/or one or more of the outputs of second circuit 910.

Figure 10:
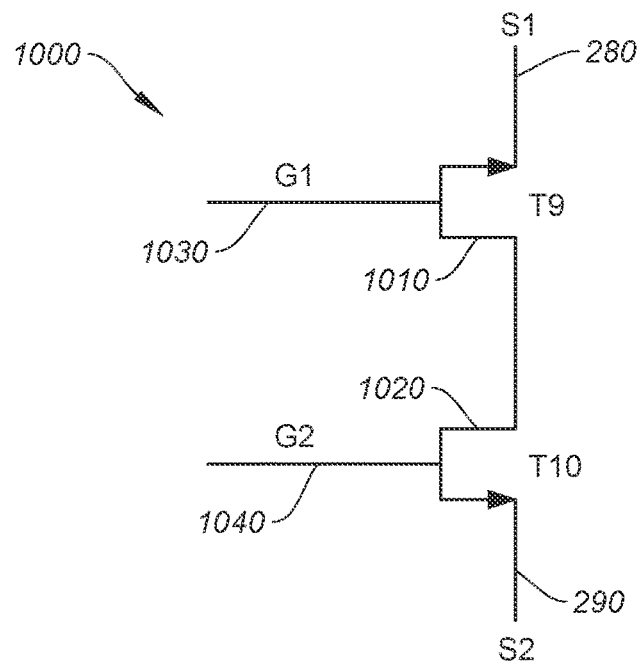
FIG. 10 illustrates a schematic illustration of an electrical circuit which may be used in either of the embodiments of FIGS. 1 and 9.

FIG. 10 illustrates a schematic illustration of a circuit 1000 which may be used as, or as at least part of first circuit 260 of FIG. 1 or 9. Circuit 1000 may be used as, or as at least part of other circuits, and first circuit 260 may additionally or alternatively use other circuits. Circuit 1000 may be configured to form a bidirectional switch, which conditionally electrically connects first and second nodes 280 and 290. Circuit 1000 includes ninth transistor T9 1010, tenth transistor T10 1020, first node S1 280, second node S2 290, first input terminal G1 1030, and second input terminal G2 1040.

Ninth transistor 1010 includes a source terminal electrically connected with first node 280 and a drain terminal electrically connected with tenth transistor 1020. Ninth transistor 1010 also includes a gate terminal connected to first input terminal 1030. Tenth transistor 1020 includes a source terminal electrically connected with second node 290 and a drain terminal electrically connected with ninth transistor 1010. Tenth transistor 1020 also includes a gate terminal connected to second input terminal 1040.

In response to the input signals at first and second input terminals 1030 and 1040, circuit 1000 conditionally causes first and second nodes 280 and 290 to be electrically connected. For example, if the input signals at first and second input terminals 1030 and 1040 are more than a threshold voltage greater than the lower of the voltages at first and second nodes 280 and 290, circuit 1000 may cause first and second nodes 280 and 290 to be electrically connected. Circuit 1000 may be monolithically formed on substrate 250. As understood by those of skill in the art, the substrate voltage of the substrate 250 affects the operational performance of the circuit 1000. For example, transistor threshold voltages, conduction impedance, leakage, and other electrical parameters may be partly dependent on the voltage of substrate 250. In addition, transitions in the voltages at first and second nodes 280 and 290, and the voltage at the drain node shared by ninth and tenth transistors 1010 and 1020 may cause changes in the voltage of substrate 250. In some embodiments, circuit 1000 also includes a driver circuit configured to control the input signals at first and second input terminals 1030 and 1040. In some, but not all embodiments, the driver circuit is also integrated and formed on substrate 250.

Figure 11:
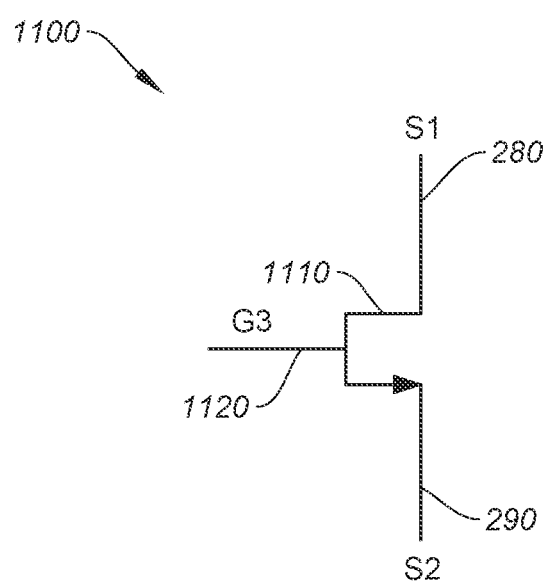
FIG. 11 illustrates a schematic illustration of an electrical circuit which may be used in either of the embodiments of FIGS. 1 and 9.

FIG. 11 illustrates a schematic illustration of a circuit 1100 which may be used as, or as at least part of first circuit 260 of FIG. 1 or 9. Circuit 1100 may be used as, or as at least part of other circuits, and first circuit 260 may additionally or alternatively use other circuits. Circuit 1100 may be configured to form a single or bidirectional switch, which conditionally electrically connects first and second nodes 280 and 290. Circuit 1100 includes eleventh transistor T11 1110, first node S1 280, second node 290, and input terminal G3 1120. Eleventh transistor 1110 includes a source terminal electrically connected with second node 290 and a drain terminal electrically connected with first node 280. Eleventh transistor 1110 also includes a gate terminal connected to input terminal 1120.

In response to the input signals at input terminal 1120 eleventh transistor 1110 conditionally causes first and second nodes 280 and 290 to be electrically connected. For example, if the input signal at input terminal is more than a threshold voltage greater than the lower of the voltages at first and second nodes 280 and 290, eleventh transistor may cause first and second nodes 280 and 290 to be electrically connected. In some embodiments, if the input signal at input terminal is more than a threshold voltage greater than the voltage at second node 290, eleventh transistor may cause first and second nodes 280 and 290 to be electrically connected.

In alternative embodiments, the source terminal of eleventh transistor 1110 is electrically connected with first node 280 and the drain terminal of eleventh transistor 1110 electrically connected with second node 290, and correspondingly functions. Circuit 1100 may be monolithically formed on substrate 250. As understood by those of skill in the art, the substrate voltage of the substrate 250 affects the operational performance of the circuit 1100. For example, transistor threshold voltages, conduction impedance, leakage, and other electrical parameters may be partly dependent on the voltage of substrate 250. In addition, transitions in the voltages at first and second nodes 280 and 290 may cause changes in the voltage of substrate 250. In some embodiments, circuit 1100 also includes a driver circuit configured to control the input signals at input terminal 1120. In some, but not all embodiments, the driver circuit is also integrated and formed on substrate 250

Cross-Over Switch Clamping Circuit

Figure 12:
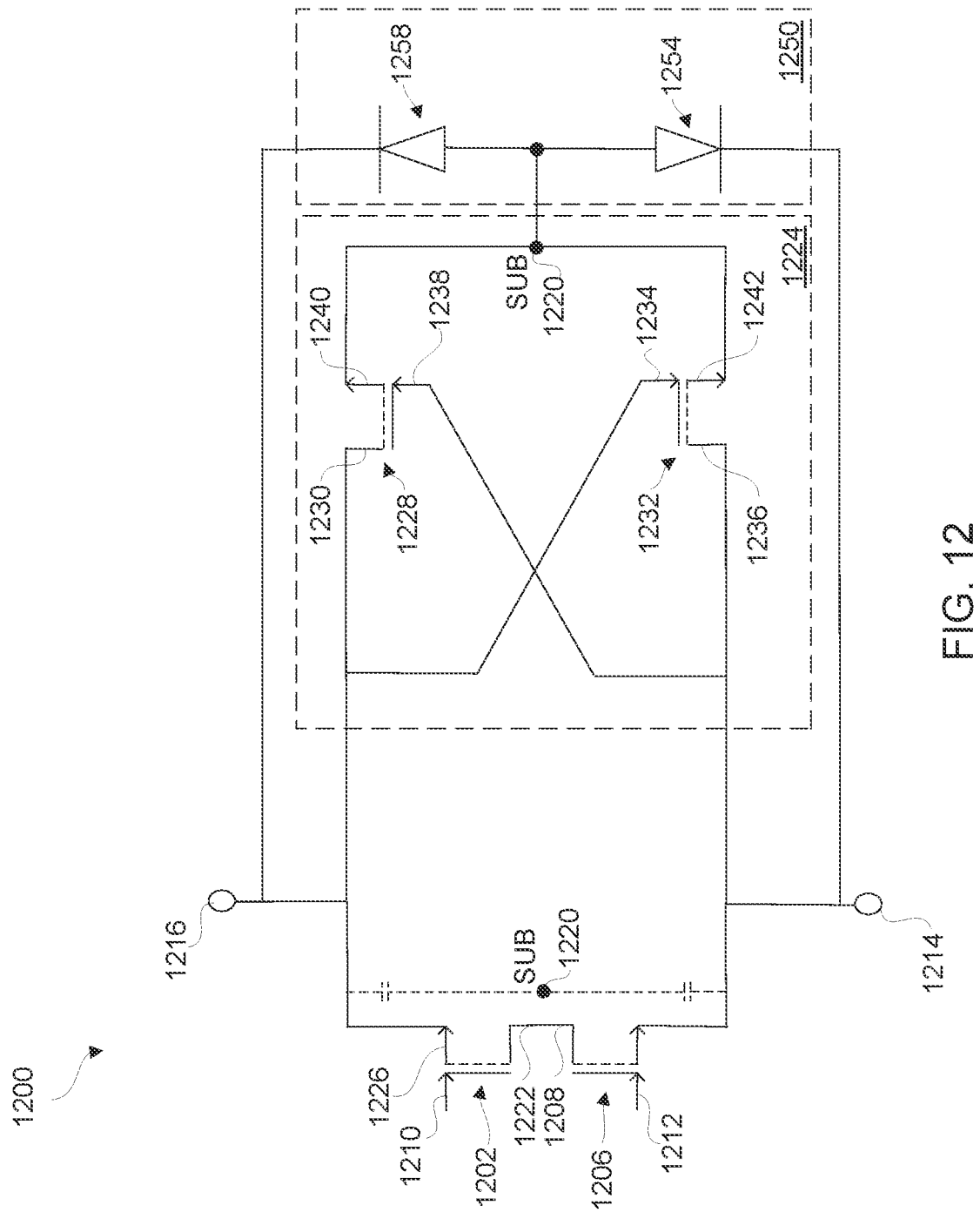
FIG. 12 illustrates a schematic illustration of an electrical circuit that may be used to control the node voltage of a switch.

FIG. 12 illustrates a simplified schematic illustration of another embodiment of a substrate clamping circuit 1200 that may be used to clamp positive and negative variations in a voltage of the substrate (e.g., substrate 114 in FIG. 1E) due to dV/dt events at the first and the second source nodes of a bi-directional switch. As shown in FIG. 12, a bidirectional switch 1202 includes a first gate input 1210, a second gate input 1212, a first source connection 1206 connected to first source node 1214, a second source connection 1226 connected to second source node 1216 and first and second drain terminals 1208, 1222, respectively.

As appreciated by one of ordinary skill in the art having the benefit of this disclosure, in some embodiments first and second drain terminals 1208, 1222, respectively, as shown in the figures may not represent physically distinct drain terminals of bidirectional switch 1202. More specifically, in some embodiments each of first and second source connections 1206, 1226, respectively, can function as a drain for the other source. For example, if a particular gate is biased "on," the 2DEG region formed therefrom becomes the respective drain terminal. Further, if a particular gate is biased "off," zero volts or anything below the threshold voltage will allow a current will flow when the Vg exceeds one threshold voltage above the opposite source connection, thus again forming a 2DEG region. Bidirectional switch 1202 may include any of the components, features, or characteristics of any of the bi-directional switches previously described, and may illustrate additional details of the circuits described above, as may be incorporated within a substrate clamping circuit according to some embodiments of the present technology. For example, the clamping circuit described in this embodiment includes a pair of cross-over clamping switches, as discussed in more detail below.

A voltage control clamping circuit 1224 includes a first FET 1228 and a second FET 1232 that are cross-coupled such that a first drain 1230 of the first FET 1228 is connected to second source node 1216 and is also connected to a second gate 1234 of second FET 1232. A second drain 1236 of second FET 1232 is connected to first source node 1214 and is also connected to the first gate 1238 of first FET 1228. First source 1240 and second source 1242 are both connected to substrate 1220.

In some embodiments voltage control clamping circuit 1224 may operate as follows. When a voltage at first source node 1214 is higher than a voltage at second source node 1216, first FET 1228 is turned on (e.g., in a conductive state) and second FET 1232 is turned off (e.g., in a non-conductive state) such that a voltage at substrate 1220 is the same as a voltage at second source node 1216 (e.g., the substrate voltage is clamped to the second source node voltage), minus the typically minimal drain to source voltage drop of first FET 1228. Similarly, when a voltage at second source node 1216 is higher than a voltage at first source node 1214, second FET 1232 is turned on and first FET 1228 is turned off such a voltage at substrate 1220 is the same as a voltage at first source node 1214 (e.g., the substrate voltage is clamped to the first source node voltage), minus the typically minimal drain to source voltage drop of second FET 1232. Thus, voltage control clamping circuit 1224 maintains substrate node 1220 at the lower voltage of first source node 1214 and second source node 1216.

In some embodiments, a substrate positive voltage control circuit 1250 can be used in addition to voltage control clamping circuit 1224 to maintain the substrate voltage below a first voltage at the first source node 1214 and below a second voltage at the second source node 1216. In various embodiments, substrate positive voltage control circuit 1250 can include a first diode 1258 coupled to a second diode 1254, wherein the first and second diodes are oriented such that both anodes are connected to substrate 1220. A first cathode of first diode 1258 is connected to second source node 1216 and a second cathode of second diode 1254 is coupled to first source node 1214. Thus, substrate positive voltage control circuit 1250 clamps the voltage of substrate 1220 (e.g., the substrate) so it doesn't go above the lower of a voltage at first source node 1214 and a voltage at second source node 1216.

More specifically, when a voltage at the anode of first diode 1258 is greater than a voltage of first source node 1214, the first diode 1258 clamps substrate 1220 to a voltage that is 1 diode turn-on voltage above a voltage of first source node 1214. First diode 1258 blocks the voltage between second source node 1216 and substrate 1220. The second diode 1254 operates similar to the first diode 1258. In some embodiments, the first diode 1258 and the second diode 1254 can be replaced by diode-connected GaN transistors that are formed in the same substrate 1220.

In various embodiments, the first diode 1258 and the second diode 1254 can silicon-based diodes. In some embodiments, the first diode 1258 and the second diode 1254 may be silicon carbide based diodes placed adjacent to the substrate 1220. The silicon carbide diodes may be co-packaged in a unitary semiconductor package, for example the silicon carbide diodes may be formed in one or more separate die that are disposed adjacent to or on top of the GaN substrate. In some embodiments, the first diode 1258 and the second diode 1254 may be co-packaged in a unitary semiconductor package along with the substrate 1220. In various embodiments, the first diode 1258 and the second diode 1254 may be silicon carbide Schottky diodes.

The circuit shown in FIG. 12 is for example purposes only and represents a simplified schematic illustration of the general concepts described herein. One of skill in the art will appreciate that various modifications can be made to the circuit which are within the scope of this disclosure.

Figure 13:
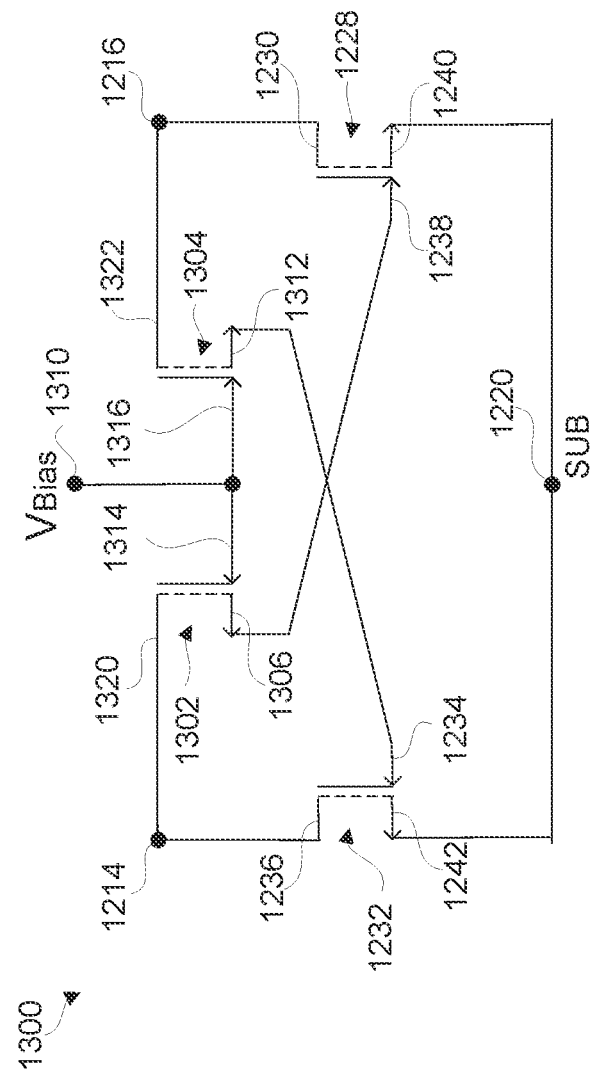
FIG. 13 illustrates a schematic illustration of an electrical circuit that may be used in an embodiment of FIG. 12.
Figure 14:
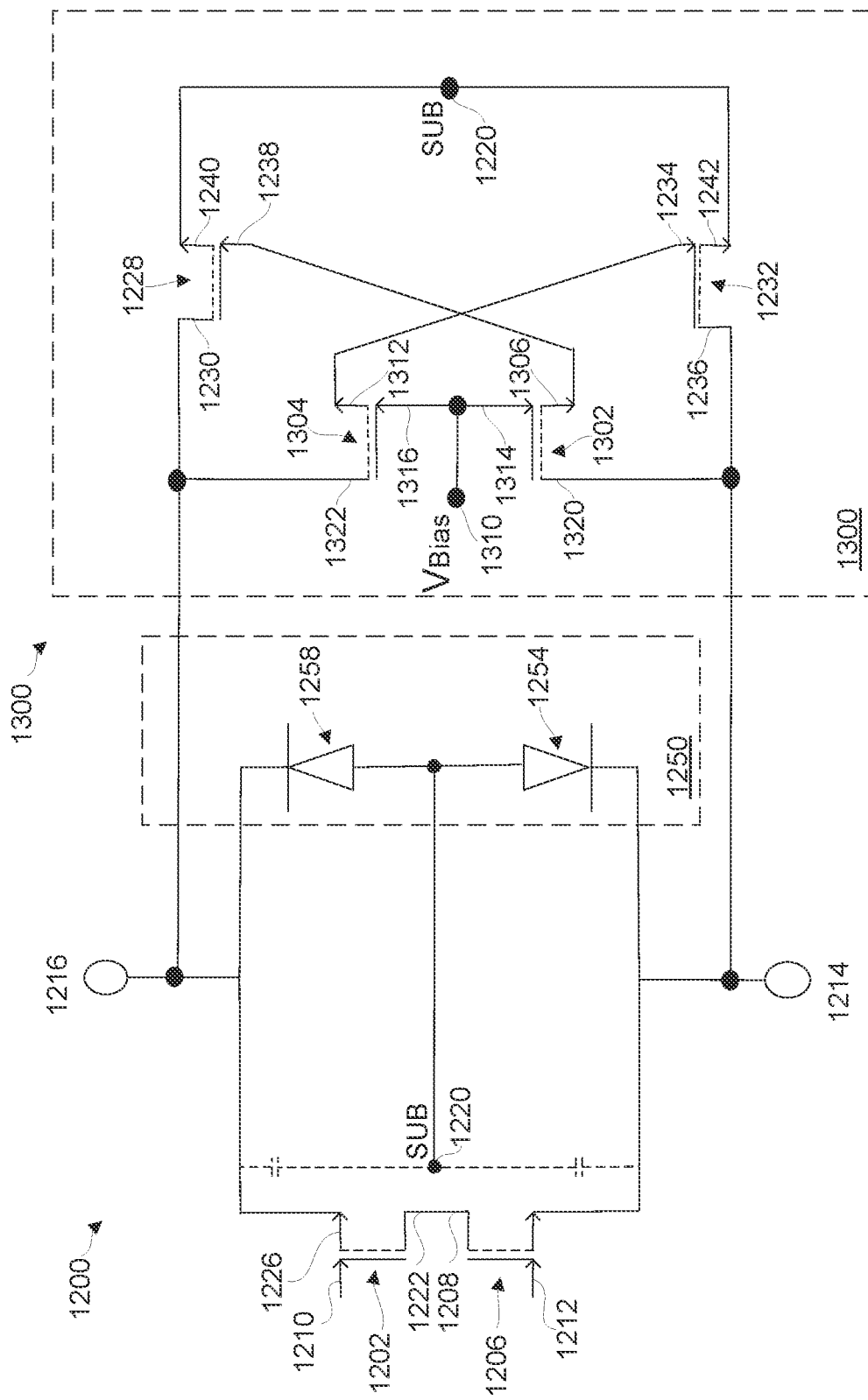
FIG. 14 illustrates a schematic illustration of an electrical circuit that may be used in an embodiment of FIGS. 12 and 13.

FIG. 13 is a simplified schematic illustration of a cross-clamp driver circuit 1300 that may be used in combination with the substrate clamping circuit 1200 shown in FIG. 12. FIG. 14 shows the cross-clamp driver circuit 1300 of FIG. 13 integrated with substrate clamping circuit 1200 of FIG. 12 with like reference numerals referring to like components. FIGS. 13 and 14 will now be described simultaneously.

In some embodiments cross-clamp driver circuit 1300 allows a wider range of voltage at first and second source node 1214, 1216, respectively, (e.g., 400 Volts or other suitable voltage) than substrate clamping circuit 1200 because of the added first and second clamp FETS 1302, 1304, respectively, that clamp the signal voltages before driving the gates of first and second FETs 1232, 1228, respectively, as explained in more detail below.

More specifically, in one embodiment, first and second clamp FETs 1302, 1304, respectively, can allow a voltage at first and second gates 1238, 1234, respectively, to stay at a relatively low voltage, for example 5 Volts, while a voltage at first and second nodes, 1214, 1216, respectively, can rise to relatively higher voltages. In some embodiments, a voltage at first and second nodes, 1214, 1216, respectively, may rise up to 600 Volts, while in other embodiments the voltage may rise up to 1200 Volts or other suitable voltage. In this way, first and second FETS 1228, 1232, respectively, can operate within their safe operating areas (SOA), such that their gate voltages stay below a voltage that may damage the FET. For example, some GaN-based transistors may have gate terminals that are capable of operating up to 6 Volts. The cross-clamp circuit 1300 can allow clamping of a substrate voltage at voltages greater than 6 Volts while keeping the GaN-based clamping transistors in their SOA.

As shown in FIG. 13, first clamp FET 1302 has a first clamp gate 1314 that is connected to a voltage source (VBias) 1310, a first clamp drain 1320 connected to first source node 1214, and a first clamp source 1306 that is connected to second gate 1234 of second FET 1228. Second clamp FET 1304 has a second clamp gate 1316 that is connected to voltage source 1310, a second clamp drain 1322 connected to second source node 1216, and a second clamp source 1312 that is connected to first gate 1238 of second FET 1232. First FET 1228 has a first drain 1230 that is connected to second source node 1216 and a first source 1240 that is connected to substrate 1220. Second FET 1232 has a second drain 1236 connected to first source node 1214 and a second source 1242 connected to substrate 1220.

In some embodiments, cross-clamp driver circuit 1300 operates as follows. First and second clamp FETs 1302, 1304, respectively, operate as clamp FETS. When voltage source 1310 is biased to a relatively low voltage (e.g., 5 Volts, or other suitable voltage) and the voltage at first source node 1214 is at a higher voltage than second source node 1216, first clamp FET 1302 drives a clamped voltage from first clamp source 1306 to second gate 1234, turning first FET 1228 on, and turning second FET 1232 off. This brings a voltage at substrate 1220 close to the voltage at second source node 1216 (e.g., within the drain to source voltage drop of first FET 1228). Conversely when a voltage at second source node 1216 is at a higher voltage than first source node 1214, second clamp FET 1304 causes second FET 1232 to turn on and first FET 1228 to turn off, bringing a voltage at substrate 1220 to the voltage of first source node 1214 (e.g., within the drain to source voltage drop of second FET 1232).

Thus, irrespective of the voltage at first and second nodes 1214, 1216, respectively, a voltage at first and second gates 1238, 1234, respectively, can be held at relatively low voltages that are equal to Vbias-Vth, where Vth is a threshold voltage for first and second clamp transistors 1302, 1304, respectively. In some embodiments, first and second clamp transistors 1302, 1304, respectively, may have different threshold voltages. For example, when Vbias=5 Volts and Vth=1 Volt, the voltage at second gate 1234 and/or first gate 1238 can be, for example, 5 V−1 V=4 V. Thus, first and second clamp transistors 1302, 1304, respectively, can prevent first and second gates 1238, 1234, respectively, from exceeding their SOA. The circuits shown in FIGS. 12 and 13 are for example purposes only and represent simplified schematic illustrations of the general concepts described herein. One of skill in the art will appreciate that various modifications can be made to the circuits which are within the scope of this disclosure.

In some embodiments first and second clamp FETs, 1302, 1304, respectively, may be enhancement-mode devices with a positive threshold voltage and thus a source voltage 1310 (Vbias) can be used to operate the FETs. In other embodiments first and second clamp FETs, 1302, 1304, respectively, may be depletion-mode devices having a negative threshold voltage and thus source voltage 1310 (Vbias) may not be needed and voltage source node 1310 could optionally be connected to substrate 1220. In some embodiments first and second clamp FETs, 1302, 1304, respectively, each comprise two or more FETs connected in series. In various embodiments first and second clamp FETs, 1302, 1304, respectively, may be fabricated on GaN, silicon, silicon-carbide or other suitable semiconductor substrate. In some embodiments first and second clamp FETs, 1302, 1304, respectively, can be monolithically formed on one unitary substrate, can be monolithically formed with bidirectional switch 1202, or, can be formed as separate discrete devices.

In some embodiments first and second FETS 1228, 1232, respectively, are enhancement mode devices while in other embodiments they can be depletion mode devices. In various embodiments first and second FETS 1228, 1232, respectively, each comprise two or more FETs connected in series. In some embodiments first and second FETS 1228, 1232, respectively, are made from GaN, silicon, silicon-carbide or other suitable material. In various embodiments first and second FETS 1228, 1232, respectively, can be monolithically formed on one unitary substrate, can be monolithically formed with bidirectional switch 1202, or, can be separate discrete devices.

In some embodiments first and second diodes 1258, 1254, respectively, are diode-connected FETs and can be depletion or enhancement mode devices. In various embodiments first and second diodes 1258, 1254, respectively, are separate discrete devices formed on GaN, silicon-carbide, silicon or other suitable semiconductor substrate. In one embodiment, first and second diodes 1258, 1254, respectively, are formed on silicon carbide and are integrally packaged with bidirectional switch 1202 in a unitary electronic package, while in some embodiments the first and second diodes are attached to a surface of bidirectional switch 1202 and in other embodiments the first and second diodes are in one or more electronic packages separate from the bidirectional switch.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In some implementations, operations or processing may involve physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining," or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. An electronic device, comprising:
a gallium nitride (GaN) substrate comprising a GaN-based top layer attached to a silicon-based bottom layer;
a bidirectional transistor switch formed on the GaN-based top layer and including a first source node, a second source node and a common drain node;
a first transistor formed on the GaN-based top layer and including a first source terminal, a first drain terminal and a first gate terminal, the first source terminal connected to the silicon-based bottom layer, the first drain terminal connected to the first source node and the first gate terminal coupled to the second source node;
a second transistor formed on the GaN-based top layer and including a second source terminal, a second drain terminal and a second gate terminal, the second source terminal connected to the silicon-based bottom layer, the second drain terminal connected to the second source node and the second gate terminal coupled to the first source node;
a third transistor formed on the GaN-based top layer and including a third drain, a third source and a third gate, the third gate connected to a voltage source, the third drain connected to the first source node and the third source connected to the second gate terminal; and
a fourth transistor formed on the GaN-based top layer and including a fourth drain, a fourth source and a fourth gate, the fourth gate connected to the voltage source, the fourth drain connected to the second source node, and the fourth source connected to the first gate terminal.

2. The electronic device of claim 1 further comprising:
a first diode including a first anode and a first cathode, the first anode connected to the silicon-based bottom layer and the first cathode connected to the first source node; and
a second diode including a second anode and a second cathode, the first anode connected to the silicon-based bottom layer and the second cathode connected to the second source node.

3. The electronic device of claim 2 wherein the first and second diodes are monolithically formed on the GaN substrate.

4. The electronic device of claim 2 wherein the first and second diodes are formed on one or more silicon carbide (SiC) substrates.

5. The electronic device of claim 1 wherein the third and fourth transistors are depletion-mode field effect transistors (FETs).

6. The electronic device of claim 1 wherein the third and fourth transistors are enhancement-mode field effect transistors (FETs).

7. The electronic device of claim 1 wherein the third and the fourth transistors each comprise two or more FETs connected in series.

8. An electronic device, comprising:
a semiconductor substrate;
a bidirectional transistor switch formed on the substrate and including a first source node, a second source node and a common drain node;
a first transistor formed on the substrate and including a first source terminal, a first drain terminal and a first gate terminal, the first source terminal connected to the substrate, the first drain terminal connected to the first source node and the first gate terminal connected to the second source node;
a second transistor formed on the substrate and including a second source terminal, a second drain terminal and a second gate terminal, wherein the second transistor is arranged to couple the second source terminal to the semiconductor substrate in response to a voltage of the first source node at a voltage that is higher than a voltage of the semiconductor substrate;
a third transistor formed on the substrate and including a third drain, a third source and a third gate, the third gate connected to a voltage source, the third drain connected to the first source node and the third source connected to the second gate terminal; and
a fourth transistor formed on the substrate and including a fourth drain, a fourth source and a fourth gate, the fourth gate connected to the voltage source, the fourth drain connected to the second source node, and the fourth source connected to the first gate terminal.

9. The electronic device of claim 8 wherein the semiconductor substrate comprises GaN.

10. The electronic device of claim 8 wherein the first transistor is arranged to couple the first source terminal to the semiconductor substrate in response to a voltage of the second source node at a voltage that is higher than a voltage of the semiconductor substrate.

11. The electronic device of claim 8 further comprising:
a first diode including a first anode and a first cathode, the first anode connected to the substrate and the first cathode connected to the first source node; and
a second diode including a second anode and a second cathode, the first anode connected to the substrate and the second cathode connected to the second source node.

12. The electronic device of claim 11 wherein the first and second diodes are monolithically formed on the substrate.

13. The electronic device of claim 11 wherein the first and second diodes are formed on one or more silicon carbide (SiC) substrates.

14. The electronic device of claim 8 wherein the third and fourth transistors are depletion-mode field effect transistors (FETs).

15. The electronic device of claim 8 wherein the third and fourth transistors are enhancement-mode field effect transistors (FETs).

16. The electronic device of claim 8 wherein the third and the fourth transistors each comprise two or more FETs connected in series.

17. A method of forming a circuit, the method comprising:
forming a semiconductor substrate;

forming a bidirectional transistor on the semiconductor substrate, the bidirectional transistor including a first source node, a second source node and a common drain node;

forming a first transistor on the substrate, the first transistor including a first source terminal, a first drain terminal and a first gate terminal, the first source terminal connected to the substrate, the first drain terminal connected to the first source node and the first gate terminal connected to the second source node;

forming a second transistor on the substrate, the second transistor including a second source terminal, a second drain terminal and a second gate terminal, the second source terminal connected to the substrate, the second drain terminal connected to the second source node, wherein the second transistor is arranged to transition from an off state to an on state in response to the first source node at a positive voltage relative to a voltage of the semiconductor substrate;

forming a third transistor on the substrate, the third transistor including a third drain, a third source, and a third gate, the third gate connected to a voltage source, the third drain connected to the first source node and the third source connected to the second gate terminal; and forming a fourth transistor on the substrate, the fourth transistor including a fourth drain, a fourth source, and a fourth gate, the fourth gate connected to the voltage source, the fourth drain connected to the second source node, and the fourth source connected to the first gate terminal.

18. The method of claim 17 wherein the semiconductor substrate comprises GaN.

19. The method of claim 17 wherein the third and fourth transistors are depletion-mode field effect transistors (FETs).

20. The method of claim 17 wherein the third and fourth transistors are enhancement-mode field effect transistors (FETs).

* * * * *